United States Patent
Hayashi et al.

(10) Patent No.: US 7,372,673 B2
(45) Date of Patent: May 13, 2008

(54) MAGNETORESISTIVE EFFECT TRANSDUCER HAVING LONGITUDINAL BIAS LAYER AND CONTROL LAYER DIRECTLY CONNECTED TO FREE LAYER

(75) Inventors: Kazuhiko Hayashi, Tokyo (JP); Keishi Ohashi, Tokyo (JP); Nobuyuki Ishiwata, Tokyo (JP); Masafumi Nakada, Tokyo (JP); Tsutomu Ishi, Tokyo (JP); Hiroaki Honjou, Tokyo (JP); Kunihiko Ishihara, Tokyo (JP); Jun-Ichi Fujikata, Tokyo (JP); Hisao Matsutera, Tokyo (JP); Hisanao Tsuge, Tokyo (JP); Atsushi Kamijo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/139,680

(22) Filed: May 31, 2005

(65) Prior Publication Data

US 2005/0219772 A1 Oct. 6, 2005

Related U.S. Application Data

(62) Division of application No. 10/241,520, filed on Sep. 12, 2002, now Pat. No. 6,950,290, which is a division of application No. 09/449,475, filed on Nov. 29, 1999, now Pat. No. 6,542,342.

(30) Foreign Application Priority Data

| Nov. 30, 1998 | (JP) | 10-338880 |
| Nov. 30, 1998 | (JP) | 10-338881 |
| May 18, 1999 | (JP) | 11-137621 |

(51) Int. Cl.
*G11B 5/39* (2006.01)

(52) U.S. Cl. .................................. 360/324.2

(58) Field of Classification Search ............. 360/324.2, 360/324.1, 327.31, 327.33, 327.1, 317.2, 360/327.3, 327.32, 319, 324.11, 324.12; 428/209
See application file for complete search history.

(56) References Cited

U.S. PATENT DOCUMENTS 5,461,526 A * 10/1995 Hamakawa et al. ... 360/327.31

(Continued)

FOREIGN PATENT DOCUMENTS

JP 2-61572 3/1990

(Continued)

OTHER PUBLICATIONS

David A. Thompson, et al., "Thin Film Magnet Resistors in Memory, Storage, and Related Application", IEEE Trans. on Magnetics, vol. MAG-11, No. 4, pp. 1039-1050, Jul. 1975.

(Continued)

*Primary Examiner*—Tianjie Chen
(74) *Attorney, Agent, or Firm*—McGinn IP Law Group, PLLC

(57) ABSTRACT

In a magnetoresistive effect transducer including a pinning layer, a pinned layer, a free layer and a non-magnetic layer inserted between the pinned layer and the free layer, a longitudinal bias layer is connected directly to a part of the free layer to apply a bias magnetic field to the free layer, thus biasing a magnetization direction of the free layer so that the magnetization direction of the free layer coincides with that of the longitudinal bias layer.

5 Claims, 42 Drawing Sheets

U.S. PATENT DOCUMENTS

| | | | |
|---|---|---|---|
| 5,532,892 A * | 7/1996 | Nix et al. | 360/327.31 |
| 5,641,557 A * | 6/1997 | Ishiwata | 428/209 |
| 5,668,688 A | 9/1997 | Dykes et al. | 360/324.1 |
| 5,754,376 A * | 5/1998 | Kobayashi et al. | 360/327.31 |
| 6,023,395 A * | 2/2000 | Dill et al. | 360/324.2 |
| 6,052,263 A | 4/2000 | Gill | 360/324.1 |
| 6,097,579 A * | 8/2000 | Gill | 360/324.2 |
| 6,111,729 A | 8/2000 | Kamiguchi et al. | 360/324.1 |
| 6,137,663 A | 10/2000 | Kurashina | 360/327.32 |
| 6,172,859 B1 | 1/2001 | Watanabe et al. | 360/327.3 |
| 6,178,071 B1 | 1/2001 | Hasegawa et al. | 360/324.1 |
| 6,178,074 B1 * | 1/2001 | Gill | 360/324.2 |
| 6,201,669 B1 | 3/2001 | Kakihara | 360/313 |
| 6,201,673 B1 | 3/2001 | Rottmayer et al. | 360/324.1 |
| 6,275,360 B1 * | 8/2001 | Nakamoto et al. | 360/319 |
| 6,327,107 B1 | 12/2001 | Komuro et al. | 360/55 |
| 6,330,136 B1 * | 12/2001 | Wang et al. | 360/324.2 |
| 6,535,362 B2 * | 3/2003 | Kawawake et al. | 360/324.1 |
| 6,950,290 B2 * | 9/2005 | Hayashi et al. | 360/324.1 |

FOREIGN PATENT DOCUMENTS

| | | |
|---|---|---|
| JP | 4-103014 | 4/1992 |
| JP | 4-358310 | 12/1992 |
| JP | 9-16918 | 1/1997 |
| JP | 10-284769 | 4/1997 |
| JP | 10-4227 | 1/1998 |
| JP | 10-162326 | 6/1998 |
| JP | 10-162327 | 6/1998 |
| JP | 10-163544 | 6/1998 |
| JP | 10-190090 | 7/1998 |
| JP | 10-255231 | 9/1998 |
| JP | 2000215415 | 8/2000 |

OTHER PUBLICATIONS

Japanese Office Action dated Mar. 22, 2001, with partial English translation.

Japanese Office Action dated Aug. 2, 2005 with partial English translation.

* cited by examiner

A  SUBSTRATE 1/LAYERS 2,3

B  SUBSTRATE 1/LAYERS 2,3,4,5,6

C  SUBSTRATE 1/LAYERS 2,3,4,5,6,7,10,9,8,12

D  SUBSTRATE 1/LAYERS 2,3,4,5,6,7,8,12

E  SUBSTRATE 1/LAYERS 2,3,4,5,6,9,8,12

A  SUBSTRATE 1/LAYERS 2,3

B  SUBSTRATE 1/LAYERS 2,3,4,5,6/INSULATING LAYER/LAYER 8

C  SUBSTRATE 1/LAYERS 2,3,4,5,6/INSULATING LAYER

D  SUBSTRATE 1/LAYERS 2,3,4,5,6/INSULATING LAYER/LAYER 12

E  SUBSTRATE 1/LAYERS 2,3,4,5,67,10,12

F  SUBSTRATE 1/LAYERS 2,3,4,5,6,7,8,10,12

G  SUBSTRATE 1/LAYERS 2,3,4,5,6/INSULATING LAYER/LAYERS 8,12

A  SUBSTRATE 1/LAYERS 2,3

B  SUBSTRATE 1/LAYERS 2,3,4,5,6,9

C  SUBSTRATE 1/LAYERS 2,3,4,5,6,9,10,8,12

D  SUBSTRATE 1/LAYERS 2,3,4,5,6,7,8,12

E  SUBSTRATE 1/LAYERS 2,3,4,5,6,9,8,12

F  SUBSTRATE 1/LAYERS 2,3,4,5,6,7,9,10,8,12

A  SUBSTRATE 1/LAYERS 2,3

B  SUBSTRATE 1/LAYERS 2,3,4,5,6/INSULATING LAYER

C  SUBSTRATE 1/LAYERS 2,3,4,5,6,10,8,12

D  SUBSTRATE 1/LAYERS 2,3,4,5,6,7,8,12

E  SUBSTRATE 1/LAYERS 2,3,4,5,6/INSULATING LAYER/LAYERS 8,12

F  SUBSTRATE 1/LAYERS 2,3,4,5,6,7,10,8,12

A  SUBSTRATE 1/LAYERS 2,3

B  SUBSTRATE 1/LAYERS 2,3,4,5,6,9

C  SUBSTRATE 1/LAYERS 2,3,4,5,6,9,8,12

D  SUBSTRATE 1/LAYERS 2,3,4,5,6,7,13,10,8,12

A  SUBSTRATE 1/LAYERS 2,3

B  SUBSTRATE 1/LAYERS 2,3,7,6,9

C  SUBSTRATE 1/LAYERS 2,3,7,10,9,12

D  SUBSTRATE 1/LAYERS 2,3,7,6,5,4,8,12

E  SUBSTRATE 1/LAYERS 2,3,7,6,9,12

F  SUBSTRATE 1/LAYERS 2,3,7,6,9,8,12

G  SUBSTRATE 1/LAYERS 2,3,7,9,8

H  SUBSTRATE 1/LAYERS 2,3,7,9,12

A  SUBSTRATE 1/LAYERS 2,3

B  SUBSTRATE 1/LAYERS 2,3,7,6,9

C  SUBSTRATE 1/LAYERS 2,3,10,7,6,9,8,12

D  SUBSTRATE 1/LAYERS 2,3,7,6,5,4,8,12

E  SUBSTRATE 1/LAYERS 2,3,7,6,9,8B,12

F  SUBSTRATE 1/LAYERS 2,3,7,6,9,8,12

Fig. 28

MTJ STRUCTURE

| | PRIOR ART | EMBODIMENTS | | | | | | |
|---|---|---|---|---|---|---|---|---|
| | Fig.3 | Fig.5 | Fig.6 | Fig.7 | Fig.8 | Fig.9 | Fig.10 | Fig.11 |
| OUTPUT VOLTAGE (mV) | 3.1 | 3.0 | 3.1 | 3.0 | 3.1 | 3.1 | 3.0 | 3.1 |
| BIT LENGTH (kFCI) | 170 | 180 | 190 | 185 | 185 | 180 | 190 | 185 |
| S/N(dB) | 21 | 31 | 30 | 30 | 29 | 29 | 31 | 31 |
| BER | $1 \times 10^{-3}$ | $1 \times 10^{-7}$ | $1 \times 10^{-7}$ | $1 \times 10^{-7}$ | $1 \times 10^{-7}$ | $1 \times 10^{-7}$ | $1 \times 10^{-7}$ | $1 \times 10^{-7}$ | kFCI : KILO FLUX CHANGES PER INCH
(DENSITY OF RECORDED BITS)

Fig. 29

SPIN VALVE STRUCTURE

| | PRIOR ART | EMBODIMENTS | | | | | | | |
|---|---|---|---|---|---|---|---|---|---|
| | Fig.3 | Fig.5 | Fig.6 | Fig.7 | Fig.8 | Fig.9 | Fig.10 | Fig.11 |
| OUTPUT VOLTAGE (mV) | 3.8 | 3.7 | 3.7 | 3.8 | 3.9 | 3.9 | 3.7 | 3.8 |
| BIT LENGTH (kFCI) | 175 | 185 | 190 | 190 | 185 | 185 | 185 | 190 |
| S/N (dB) | 20 | 33 | 34 | 33 | 30 | 31 | 33 | 33 |
| BER | $2 \times 10^{-3}$ | $1 \times 10^{-7}$ | $1 \times 10^{-7}$ | $1 \times 10^{-7}$ | $1 \times 10^{-7}$ | $1 \times 10^{-7}$ | $1 \times 10^{-7}$ | $1 \times 10^{-7}$ | kFCI : KILO FLUX CHANGES PER INCH (DENSITY OF RECORDED BITS)

Fig. 30

| SAMPLE NO. | FiG.3 | FiG.7 | FiG.7 -1 | FiG.7 -2 | FiG.7 -3 | FiG.8 | FiG.8 -1 | FiG.8 -2 | FiG.8 -3 | FiG.9 | FiG.9 -1 | FiG.9 -2 | FiG.9 -3 | FiG.10 | FiG.11 | FiG.11 -1 |
|---|---|---|---|---|---|---|---|---|---|---|---|---|---|---|---|---|
| 1 | 0 | 2.9 | 3.1 | 2.1 | 2.8 | 2.4 | 3.0 | 0 | 0.1 | 1.9 | 2.8 | 0.2 | 0 | 3.1 | 2.8 | 3.1 |
| 2 | 0 | 3.2 | 2.8 | 0 | 0 | 3.1 | 2.9 | 0 | 0 | 2.9 | 2.8 | 0 | 3.1 | 3.2 | 0 | 0 |
| 3 | 0 | 2.9 | 2.9 | 0.2 | 0 | 3.1 | 2.5 | 0.2 | 0.1 | 2.9 | 2.9 | 0.2 | 0.1 | 3.1 | 2.9 | 3.2 |
| 4 | 0 | 2.8 | 3.2 | 2.8 | 0 | 3.0 | 3.4 | 2.9 | 0 | 3.3 | 2.4 | 0 | 0 | 2.8 | 3.0 | 2.9 |
| 5 | 0 | 0.2 | 3.1 | 0.1 | 0 | 3.3 | 3.1 | 0.2 | 3.1 | 3.2 | 3.4 | 0.2 | 0 | 2.4 | 0.1 | 3.0 |
| 6 | 0 | 3.1 | 2.9 | 0 | 0.1 | 2.8 | 3.0 | 0.2 | 0.1 | 3.1 | 2.8 | 3.5 | 0.1 | 2.1 | 3.2 | 3.1 |
| 7 | 3.1 | 2.9 | 3.2 | 3.3 | 0.1 | 2.5 | 2.8 | 0 | 0 | 2.8 | 2.8 | 0.1 | 0 | 2.8 | 3.1 | 3.4 |
| 8 | 0 | 3.1 | 3.1 | 0 | 0 | 3.1 | 2.8 | 2.4 | 0 | 0.1 | 0.1 | 0.2 | 2.9 | 2.5 | 3.3 | 3.1 |
| 9 | 0 | 3.1 | 2.4 | 0.1 | 0 | 3.1 | 0.1 | 0.2 | 0 | 2.9 | 1.8 | 0.1 | 0 | 3.1 | 2.8 | 0 |
| 10 | 0.4 | 2.1 | 0 | 0 | 0 | 2.1 | 2.8 | 0.1 | 0 | 2.8 | 0.1 | 0.1 | 0 | 2.1 | 0 | 0 |
| YIELD (%) | 10 | 80 | 80 | 20 | 10 | 70 | 80 | 10 | 10 | 70 | 70 | 10 | 20 | 60 | 70 | 80 |

ACCEPTABLE OUTPUT VOLTAGE $\geq$ 2.8mV

MAGNETORESISTIVE EFFECT TRANSDUCER HAVING LONGITUDINAL BIAS LAYER AND CONTROL LAYER DIRECTLY CONNECTED TO FREE LAYER

The present Application is a Divisional Application of U.S. patent application No. 10/241,520, filed on Sep. 12, 2002, now U.S. Pat. No. 6,950,290, which is, in turn, a Divisional Application of U.S. patent application No. 09/449,475, filed on Nov. 29, 1999, now U.S. Pat. No. 6,542,342.

BACKGROUND OF THE INVENTION

1. Field of the Invention

The present invention relates to a magnetoresistive (MR) effect transducer which can be used as a read head for sensing a leakage magnetic field from a magnetic medium.

2. Description of the Related Art

MR effect transducers are divided into a ferromagnetic tunneling junction (MTJ)-type and a spin value type.

An MTJ structure of the MTJ-type MR effect transducer is constructed by a pinned ferromagnetic layer, a free ferromagnetic layer and a non-magnetic insulating layer sandwiched by the pinned ferromagnetic layer and the free ferromagnetic layer.

On the other hand, a spin valve type MR effect transducer is constructed by a pinned ferromagnetic layer, a free ferromagnetic layer and a non-magnetic conductive layer sandwiched by the pinned ferromagnetic layer and the free ferromagnetic layer.

In a prior art MTJ-type MR effect transducer (see JP-A-10-162327), longitudinal bias ferromagnetic layers are provided at the side of the MTJ structure to provide magnetic domain control over the free ferromagnetic layer, thus suppressing the Barkhausen noise. This will be explained later in detail.

On the other hand, in a prior art spin value type MR effect transducer (see U.S. Pat. No. 5,668,688), longitudinal bias ferromagnetic layers are also provided at the side of the spin value structure to provide magnetic domain control over the free ferromagnetic layer, thus suppressing the Barkhausen noise.

In the above-described prior art MR effect transducers, however, since the free ferromagnetic layer is separated from the longitudinal bias ferromagnetic layer by a magnetic isolation layer, it is difficult to apply a sufficiently large magnetic bias field to the free ferromagnetic layer, which would increase the noise in reproduced signals.

In addition, in the above-described prior art MR effect transducers, each layer of the MTJ or spin value structure has the same pattern. Therefore, when the MTJ or spin value structure is patterned by a milling process, metal particles or contamination may be adhered to the sides of the non-magnetic layer, so that the pinned ferromagnetic layer and the free ferromagnetic layer are short-circuited by the metal particles or contamination adhered to the sides of the non-magnetic layer. This would decrease the manufacturing yield of MR effect transducers.

SUMMARY OF THE INVENTION

It is an object of the present invention to improve the noise characteristics of MR effect transducers.

Another object of the present invention is to improve the manufacturing yield of MR effect transducers.

According to the present invention, in a magnetoresistive effect transducer including a pinning layer, a pinned layer, a free layer and a non-magnetic layer inserted between the pinned layer and the free layer, a longitudinal bias layer is connected directly to a part of the free layer to apply a bias magnetic field to the free layer, thus biasing a magnetization direction of the free layer so that the magnetization direction of the free layer coincides with that of the longitudinal bias layer. Thus, the noise characteristics are improved.

Also, an uppermost layer of the MTJ or spin value is patterned by a milling process, so that the uppermost layer has a smaller pattern than the other layers. This would prevent metal particles or contamination from adhering to the non-magnetic layer, thus improving the manufacturing yield.

BRIEF DESCRIPTION OF THE DRAWINGS

The present invention will be more clearly understood from the description set forth below, as compared with the prior art, with reference to the accompanying drawings, wherein:

FIG. 28 is a table showing the noise characteristics of the MR effect transducers of FIGS. 5, 6, 7, 8, 9, 10 and 11 where an MTJ structure is adoped;

FIG. 29 is a table showing the noise characteristics of the MR effect transducers of FIGS. 5, 6, 7, 8, 9, 10 and 11 where a spin value structure is adoped; and FIG. 30 is a table showing the manufacturing yield characteristics of the MR effect transducers of FIGS. 7, 8, 9, 10 and 11.

DESCRIPTION OF THE PREFERRED EMBODIMENTS

Before the description of the preferred embodiments, a prior art MTJ-type MR effect transducer will be explained with reference to FIGS. 1, 2 and 3.

Figure 1:
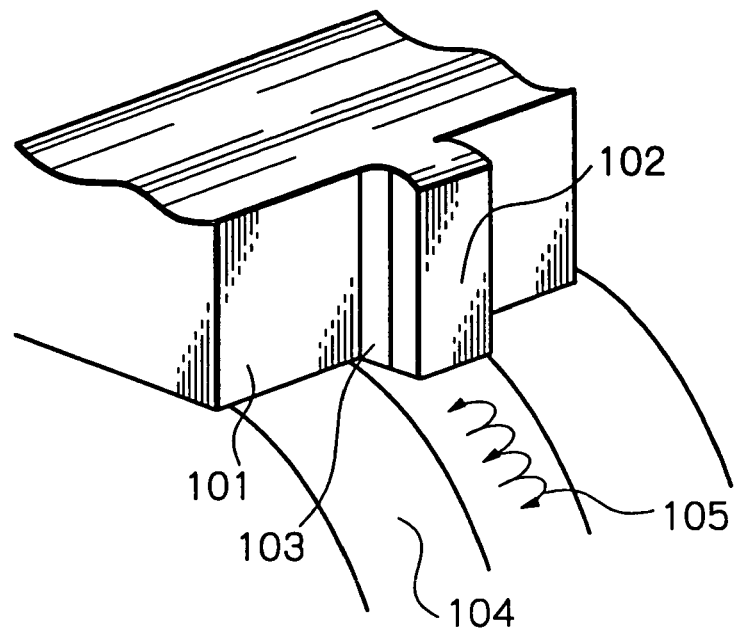
FIG. 1 is a perspective view illustrating a prior art magnetic write/read apparatus.

In FIG. 1, which illustrates a prior art magnetic write/read apparatus, reference numeral 101 designates a substrate serving as a head slider having a write head 102 and a read head 103 thereon. The head slider 101 relatively moves on a recording medium 104 with a gap of less than 0.2 μm or in contact with the recording medium 104. Note that the recording medium 104 actually rotates. As a result, the read head 103 reads magnetic signals recorded on the magnetic medium 104 by sensing a leakage magnetic field 105.

Figure 2:
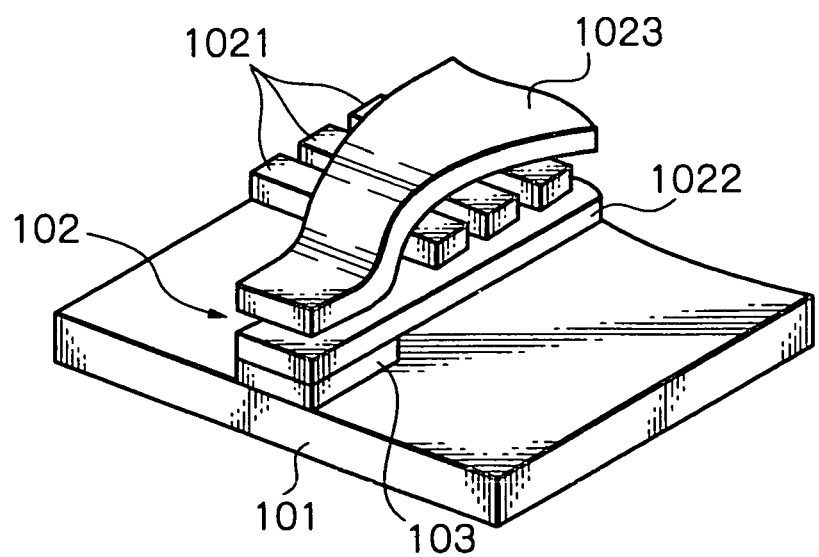
FIG. 2 is a detailed perspective view of the write head and the read head of FIG. 1.

In FIG. 2, which is a detailed perspective view of the write head 102 and the read head 103 of FIG. 1, the write head 102 is constructed by a winding 1021 sandwiched by two magnetic poles 1022 and 1023, and the read head 103 is provided between the head slider 101 and the magnetic pole 1022. The read head 103 is constructed by an MTJ-type MR effect transducer.

Figure 3:
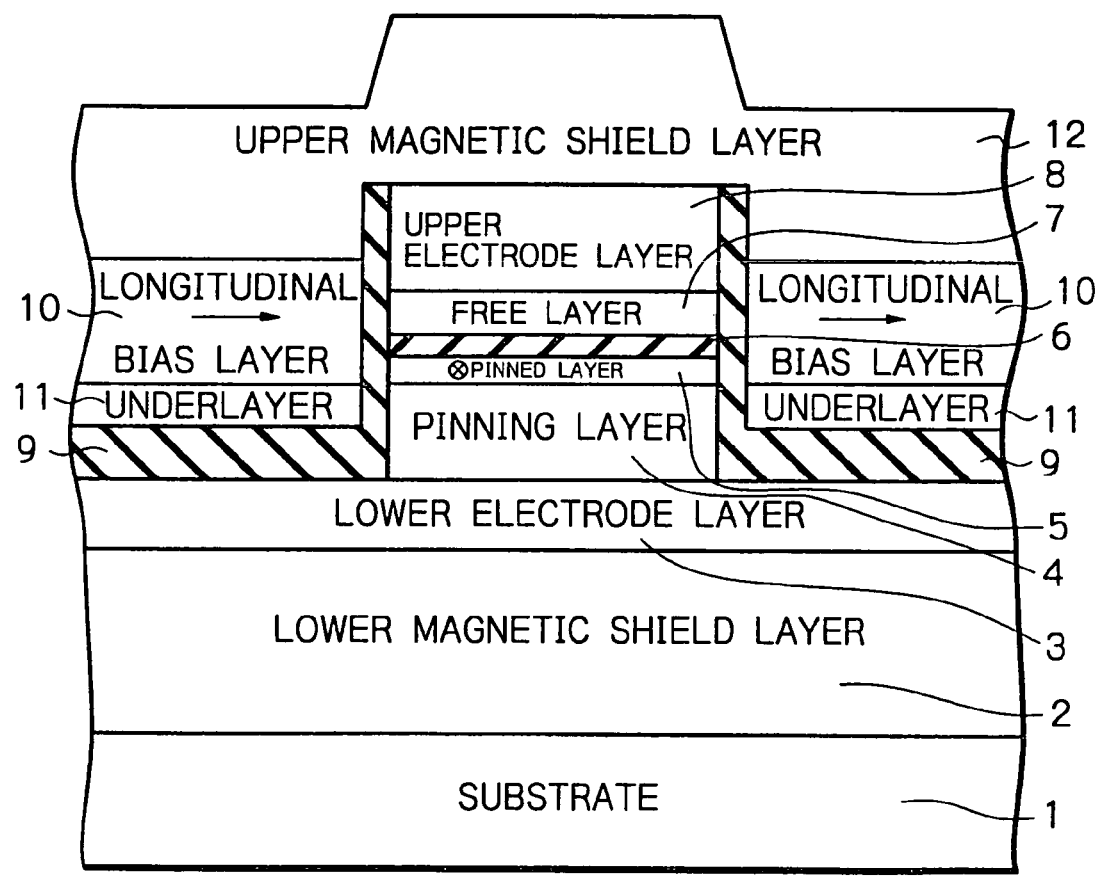
FIG. 3 is a cross-sectional, air bearing surface (ABS) view of the MTJ-type MR effect transducer of FIG. 2.

In FIG. 3, which is a cross-sectional, ABS view of the MTJ-type MR effect transducer of FIG. 2 (see JP-A-10-162327), reference numeral 1 designates a substrate on which a lower magnetic shield layer 2 and a lower electrode layer 3 are formed.

An MTJ structure is formed on the lower electrode layer 3. That is, the MTJ structure is constructed by a pinning layer 4 made of antiferromagnetic material, a pinned layer 5 made of ferromagnetic material, a barrier layer 6 made of non-magnetic insulating material, and a free layer 7 made of ferromagnetic material. The pinning layer 4 provides an anisotropic exchange coupling with the pinned layer 5. Therefore, the direction of the magnetization of the pinned layer 5 is pinned with its easy axis perpendicular to the air bearing surface (ABS). Further, an upper electrode layer 8 is formed on the MTJ structure.

The sidewalls of the MTJ structure and the upper electrode layer 8 as well as the upper surface of the lower electrode layer 3 are covered by an insulating layer 9.

Longitudinal bias layers 10 made of ferromagnetic material along with their underlayers 11 are formed substantially at the sides of the MTJ structure to provide magnetic domain control over the free layer 7.

An upper magnetic shield layer 12 is formed on the upper electrode layer 8 and the longitudinal bias layers 10. Thus, the MTJ structure is protected by the lower magnetic shield layer 2 and the upper magnetic shield layer 12.

In the MTJ-type MR effect transducer of FIG. 3, a tunnel current flowing through the barrier layer 6 between the lower electrode layer 3 and the upper electrode layer 8 is dependent on the relationship in magnetization between the pinned layer 5 and the free layer 7. In this case, the longitudinal bias layers 10 bias the magnetization of the free layer 7, so that the direction of the magnetization of the free layer 7 coincides with that of the longitudinal bias layers 10, thus suppressing the Barkhausen noise.

Figure 4A:
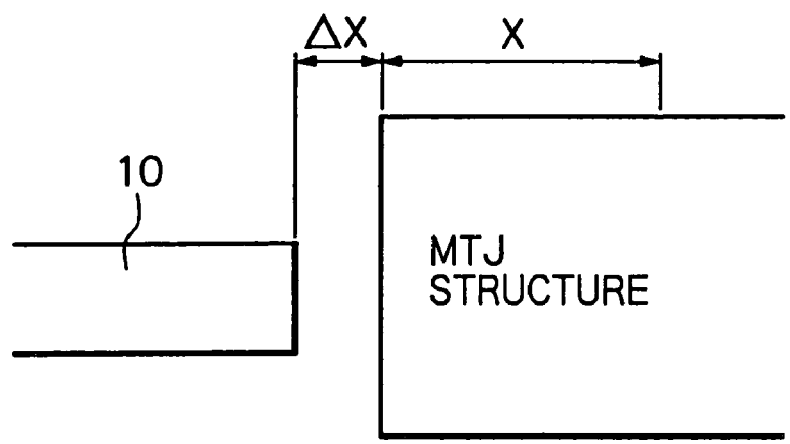
FIG. 4A is a cross-sectional view for explaining the distance between the MTJ structure and the longitudinal bias layer of FIG. 3.
Figure 4B:
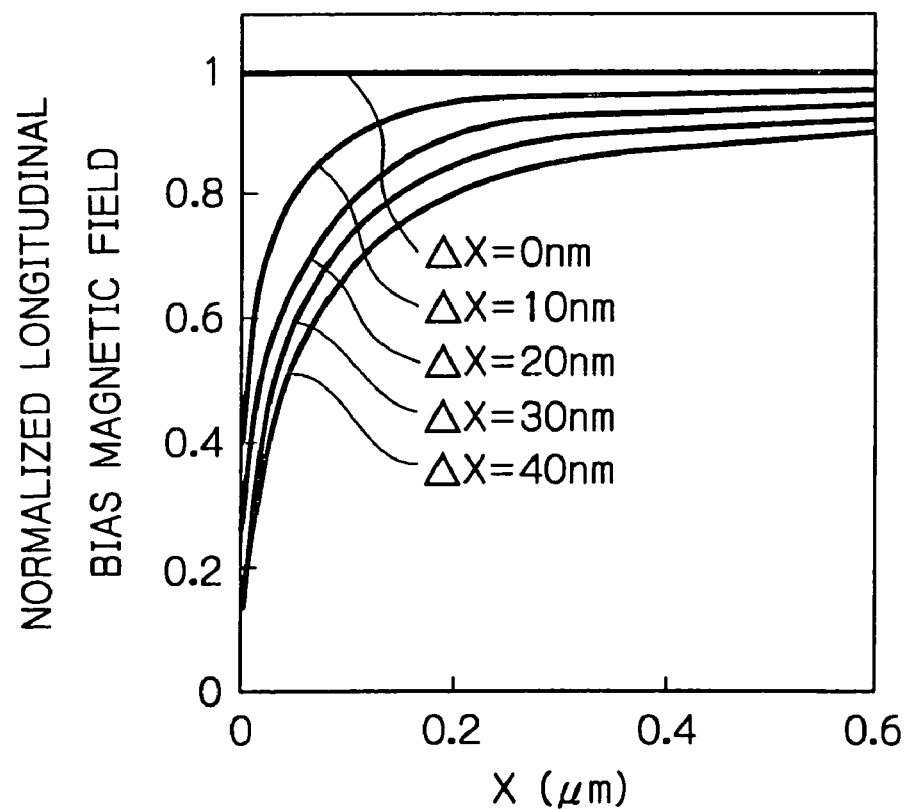
FIG. 4B is a graph showing the normalized longitudinal bias magnetic field with the MTJ structure of FIG. 4A.

In the MTJ-type MR effect transducer of FIG. 3, however, since the insulating layer 9 also serves as a magnetic isolation layer between the free layer 7 and the longitudinal bias layers 10, it is difficult to apply a sufficiently large magnetic bias field to the free layer 7. Therefore, the magnetic domain of the free layer 7 cannot sufficiently be controlled, so that a large hysteresis is created in the resistance and magnetic field (R-H) loop, which would increase the noise in regenerated signals. That is, if a distance between the MTJ structure and the longitudinal bias layers 10, i.e., the sidewall thickness of the insulating layer 9 is defined by $\Delta X$ as shown in FIG. 4A, the longitudinal bias magnetic field within the MTJ structure (the free layer 7) is homogeneous when $\Delta X=0$ as shown in FIG. 4B. However, the larger the distance $\Delta X$, the smaller the longitudinal bias magnetic field at the edge of the MTJ structure (the free layer 7).

In addition, in the MTJ-type MR effect transducer of FIG. 3, each layer of the MTJ structure, particularly, each of the pinned layer 5, the barrier layer 6 and the free layer 7, has the same pattern. Therefore, when the MTJ structure is patterned by a milling process, metal particles or contamination may be adhered to the sides of the barrier layer 6, so that the pinned layer 5 and the free layer 7 are short-circuited by the metal particles or contamination adhered to the sides of the barrier layer 6. This would decrease the manufacturing yield of MTJ-type MR effect transducers.

Figure 5:
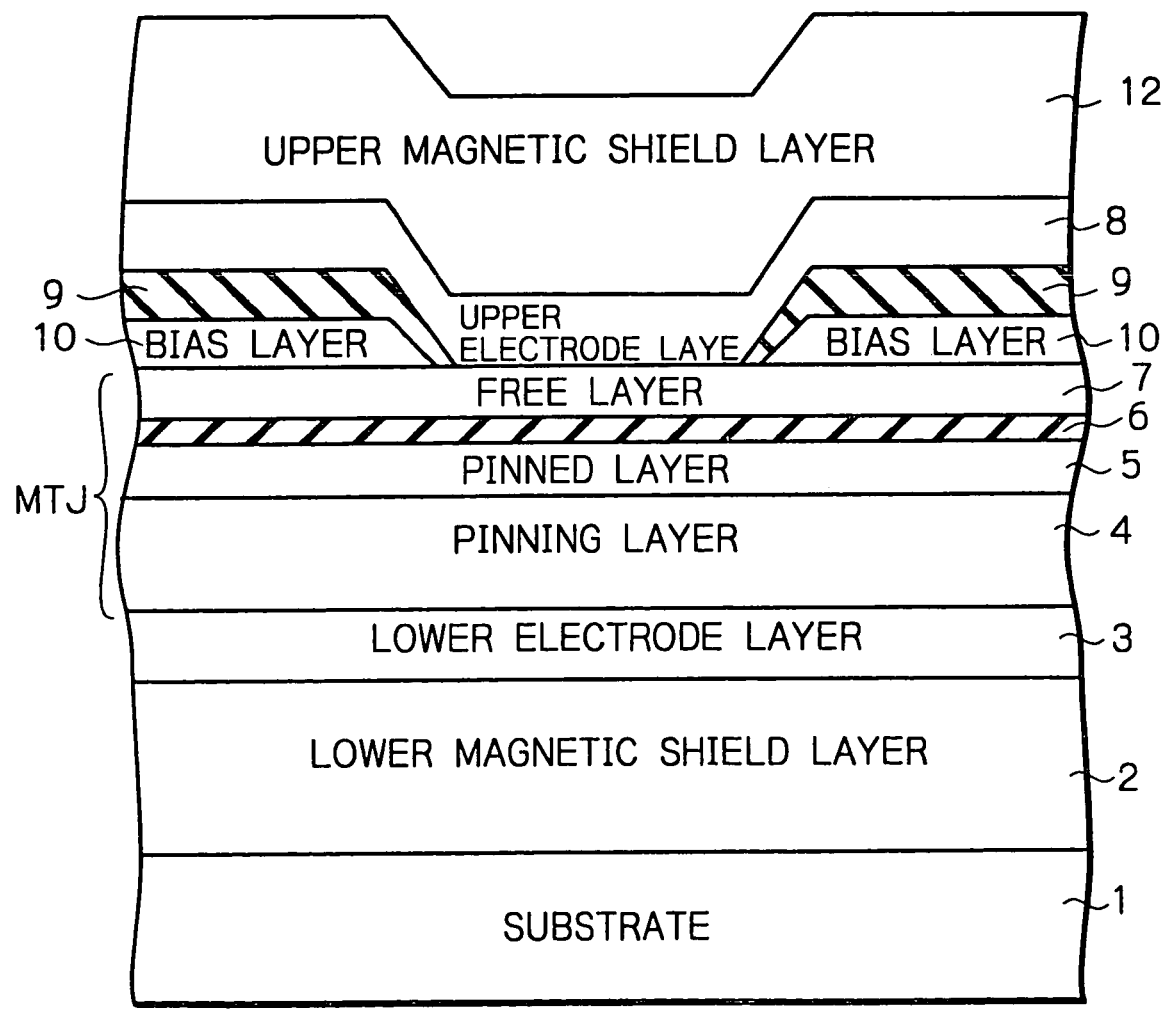
FIG. 5 is a cross-sectional, ABS view illustrating a first embodiment of the MTJ-type MR effect transducer according to the present invention.

In FIG. 5, which illustrates a first embodiment of the MTJ-type MR effect transducer according to the present invention, a lower magnetic shield layer 2, a lower electrode layer 3, a pinning layer 4, a pinned layer 5, a barrier layer 6 and a free layer 7 are sequentially formed on a substrate 1.

Also, patterned longitudinal bias layers 10 and patterned insulating layers 9 are formed on the free layer 7.

Further, an upper electrode layer 8 and an upper magnetic shield layer 12 are sequentially formed on the free layer 7 and the insulating layers 9, thus completing the MTJ-type MR effect transducer of FIG. 5.

In the MTJ-type MR effect transducer of FIG. 5, a tunnel current flows from the lower electrode 3 via the pinning layer 4, the pinned layer 5, the barrier layer 6 and the free layer 7 to the upper electrode layer 8. In this case, since the longitudinal bias layers 10 deviate from the path of the tunnel current, the tunnel current never flows from or to the longitudinal bias layers 10.

In the MTJ-type MR effect transducer of FIG. 5, since the longitudinal bias layers 10 are connected directly to the free layer 7, a longitudinal bias magnetic field can sufficiently be applied from the longitudinal bias layers 10 to the free layer 7.

In addition, in the MTJ-type MR effect transducer of FIG. 5, since the MTJ structure is not patterned by a milling process, metal particles or contamination may not be adhered to the sides of barrier layer 6, so that the pinned layer 5 and the free layer 7 are hardly short-circuited. This would increase the manufacturing yield of MTJ-type MR effect transducers.

In FIG. 5, note that an insulating gap layer can be inserted between the lower magnetic shield layer 2 and the lower electrode layer 3, and an insulating gap layer can be inserted between the upper electrode layer 8 and the upper magnetic shield layer 12. Also, the lower magnetic shield layer 2 can serve as the lower electrode layer 3, and the upper magnetic shield layer 12 can serve as the upper electrode layer 8. Further, an underlayer can be inserted between the lower electrode layer 3 and the pinning layer 4, and an upper layer can be inserted between the free layer 7 and the upper electrode layer 8.

Figure 6:
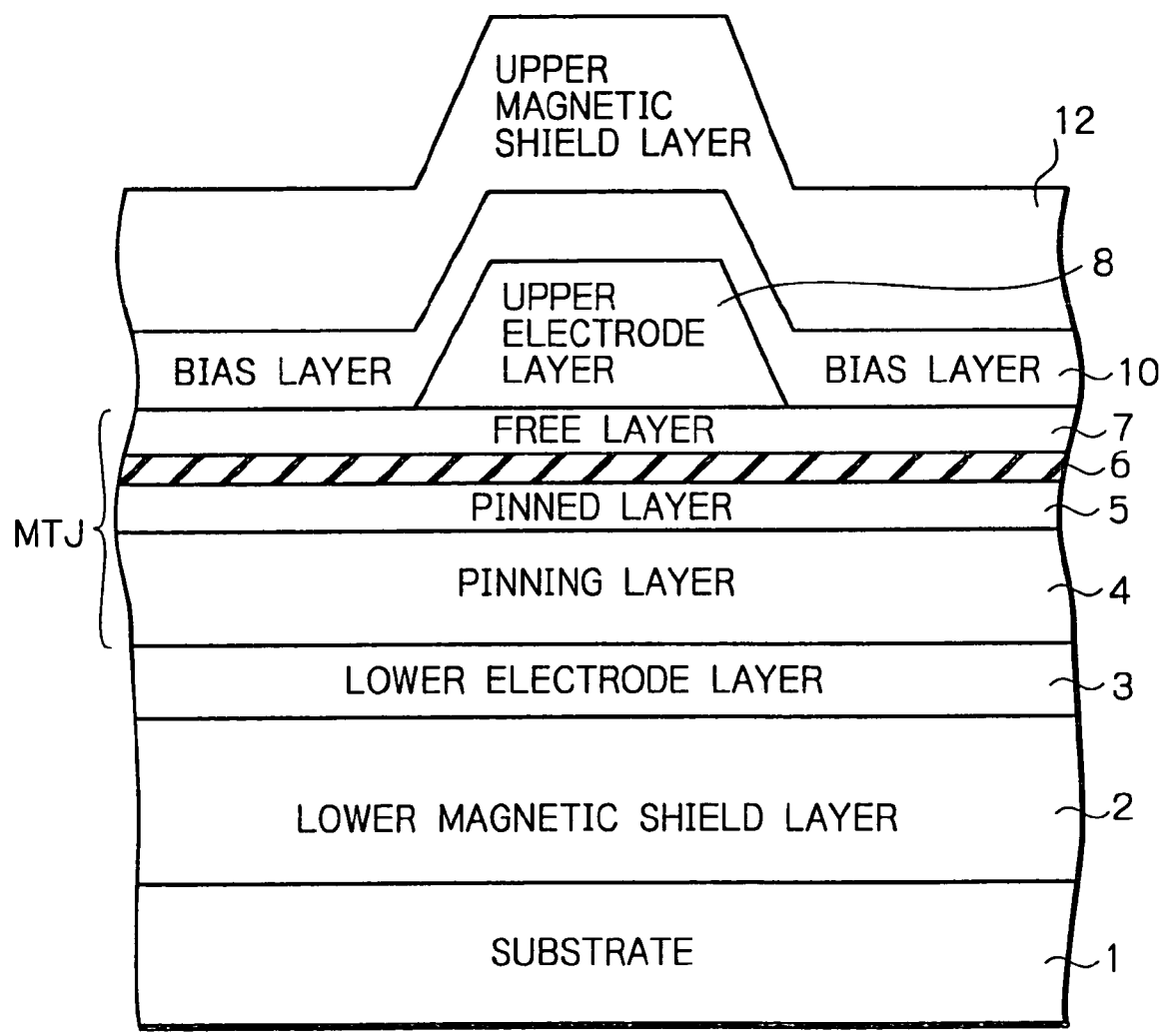
FIG. 6 is a cross-sectional, ABS view illustrating a second embodiment of the MTJ-type MR effect transducer according to the present invention.

In FIG. 6, which illustrates a second embodiment of the MTJ-type MR effect transducer according to the present invention, a lower magnetic shield layer 2, a lower electrode layer 3, a pinning layer 4, a pinned layer 5, a barrier layer 6 and a free layer 7 are sequentially formed on a substrate 1.

Also, a patterned upper electrode layer 8 is formed on the free layer 7.

Further, a patterned longitudinal bias layer 10 and an upper magnetic shield layer 12 are sequentially formed on the free layer 7 and the upper electrode layer 8, thus completing the MTJ-type MR effect transducer of FIG. 6.

In the MTJ-type MR effect transducer of FIG. 6, a tunnel current flows from the lower electrode 3 via the pinning layer 4, the pinned layer 5, the barrier layer 6 and the free layer 7 to the upper electrode layer 8. In this case, since the longitudinal bias layer 10 deviates from the path of the tunnel current, the tunnel current never flows from or to the longitudinal bias layer 10.

In the MTJ-type MR effect transducer of FIG. 6, since the longitudinal bias layer 10 is connected directly to the free layer 7, a longitudinal bias magnetic field can sufficiently be applied from the longitudinal bias layer 10 to the free layer 7.

In addition, in the MTJ-type MR effect transducer of FIG. 6, since the free layer 7 of the MTJ structure is patterned by a milling process but the pinned 5 and the barrier layer 6 of the MTJ structure are not patterned by the milling process, metal particles or contamination may not be adhered to the sides of the barrier layer 6, so that the pinned layer 5 and the free layer 7 are hardly short-circuited. This would increase the manufacturing yield of MTJ-type MR effect transducers.

In FIG. 6, note that an insulating gap layer can be inserted between the lower magnetic shield layer 2 and the lower electrode layer 3, and an insulating gap layer can be inserted between the bias layer 10 and the upper magnetic shield layer 12. Also, the lower magnetic shield layer 2 can serve as the lower electrode layer 3. Further, an underlayer can be inserted between the lower electrode layer 3 and the pinning layer 4, and an upper layer can be inserted between the free layer 7 and the upper electrode layer 8.

Figure 7:
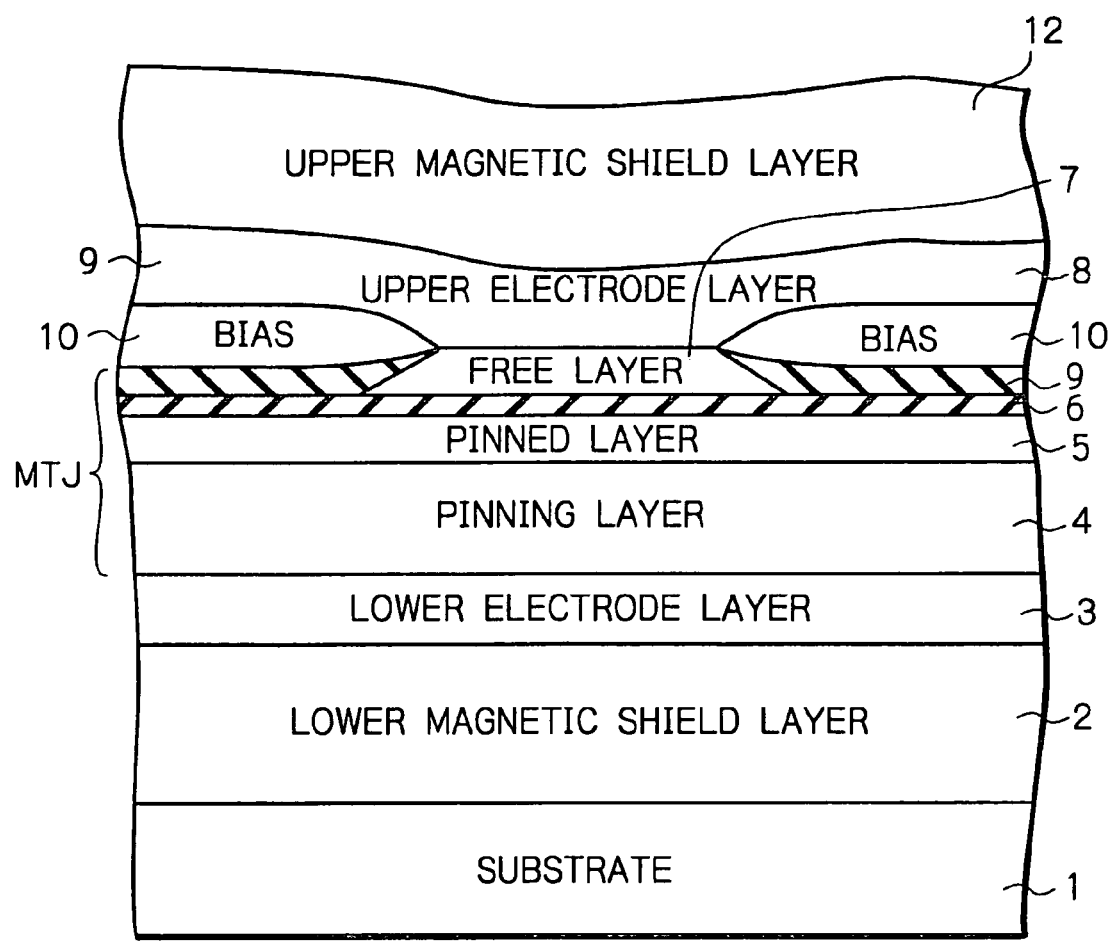
FIG. 7 is a cross-sectional, ABS view illustrating a third embodiment of the MTJ-type MR effect transducer according to the present invention.

In FIG. 7, which illustrates a third embodiment of the MTJ-type MR effect transducer according to the present invention, a lower magnetic shield layer 2, a lower electrode layer 3, a pinning layer 4, a pinned layer 5 and a barrier layer 6 are sequentially formed on a substrate 1.

Also, a patterned free layer 7 patterned insulating layers 9 and patterned longitudinal bias layers 10 are formed on the barrier layer 6.

Further, an upper electrode layer 8 and an upper magnetic shield layer 12 are sequentially formed on the free layer 7 and the bias layers 10, thus completing the MTJ-type MR effect transducer of FIG. 7.

In the MTJ-type MR effect transducer of FIG. 7, a tunnel current flows from the lower electrode 3 via the pinning layer 4, the pinned layer 5, the barrier layer 6 and the free layer 7 to the upper electrode layer 8. In this case, since the longitudinal bias layers 10 deviate from the path of the tunnel current, the tunnel current never flows from or to the longitudinal bias layers 10.

In the MTJ-type MR effect transducer of FIG. 7, since the longitudinal bias layers 10 are connected directly to the ends of the free layer 7, a longitudinal bias magnetic field can sufficiently be applied from the longitudinal bias layers 10 to the free layer 7.

In addition, in the MTJ-type MR effect transducer of FIG. 7, since the free layer 7 of the MTJ structure is patterned by a milling process but the pinned layer 5 and the barrier layer 6 of the MTJ structure are not patterned by the milling process, metal particles or contamination may not be adhered to the sides of barrier layer 6, so that the pinned layer 5 and the free layer 7 are hardly short-circuited. This would increase the manufacturing yield of MTJ-type MR effect transducers.

In FIG. 7, note that an insulating gap layer can be inserted between the lower magnetic shield layer 2 and the lower electrode layer 3, and an insulating gap layer can be inserted between the upper electrode layer 8 and the upper magnetic shield layer 12. Also, the lower magnetic shield layer 2 can serve as the lower electrode layer 3, and the upper magnetic shield layer 12 can serve as the upper electrode layer 8. Further, an underlayer can be inserted between the lower electrode layer 3 and the pinning layer 4, and an upper layer can be inserted between the free layer 7 and the upper electrode layer 8.

Figure 8:
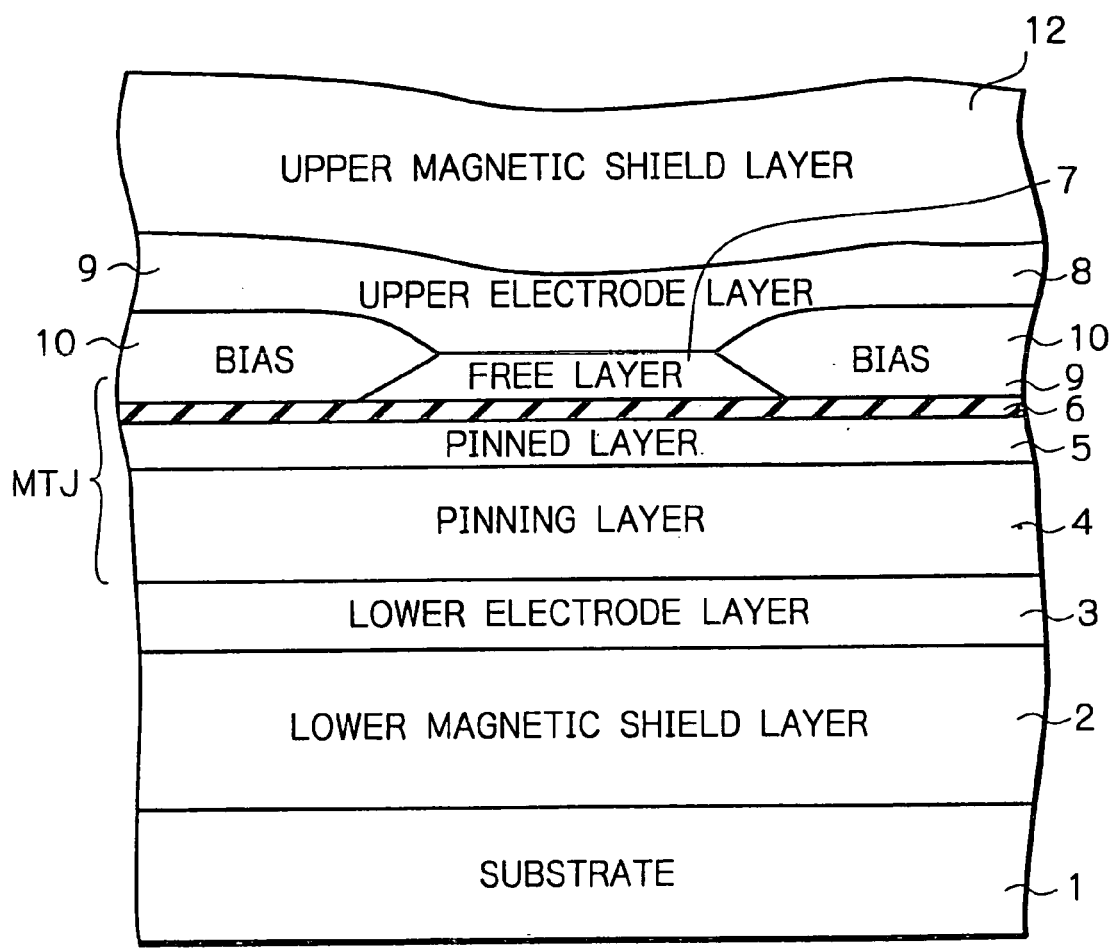
FIG. 8 is a cross-sectional, ABS view illustrating a fourth embodiment of the MTJ-type MR effect transducer according to the present invention.

In FIG. 8, which illustrates a fourth embodiment of the MTJ-type MR effect transducer according to the present invention, a lower magnetic shield layer 2, a lower electrode layer 3, a pinning layer 4, a pinned layer 5 and a barrier layer 6 are sequentially formed on a substrate 1.

Also, a patterned free layer 7 and patterned longitudinal bias layers 10 are formed on the barrier layer 6.

Further, an upper electrode layer 8 and an upper magnetic shield layer 12 are sequentially formed on the free layer 7 and the bias layers 10, thus completing the MTJ-type MR effect transducer of FIG. 8.

In the MTJ-type MR effect transducer of FIG. 8, a tunnel current flows from the lower electrode 3 via the pinning layer 4, the pinned layer 5, the barrier layer 6 and the free layer 7 to the upper electrode layer 8. In this case, since the longitudinal bias layers 10 deviate from the path of the tunnel current, the tunnel current never flows from or to the longitudinal bias layers 10.

In the MTJ-type MR effect transducer of FIG. 8, since the longitudinal bias layers 10 are connected directly to the free layer 7, a longitudinal bias magnetic field can sufficiently be applied from the longitudinal bias layers 10 to the free layer 7.

In addition, in the MTJ-type MR effect transducer of FIG. 8, since the free layer 7 of the MTJ structure is patterned by a milling process but the pinned layer 5 and the barrier layer 6 of the MTJ structure are not patterned by the milling process, metal particles or contamination may not be adhered to the sides of barrier layer 6, so that the pinned layer 5 and the free layer 7 are hardly short-circuited. This would increase the manufacturing yield of MTJ-type MR effect transducers.

In FIG. 8, note that an insulating gap layer can be inserted between the lower magnetic shield layer 2 and the lower electrode layer 3, and an insulating gap layer can be inserted between the upper electrode layer 8 and the upper magnetic shield layer 12. Also, the lower magnetic shield layer 2 can serve as the lower electrode layer 3, and the upper magnetic shield layer 12 can serve as the upper electrode layer 8. Further, an underlayer can be inserted between the lower electrode layer 3 and the pinning layer 4, and an upper layer can be inserted between the free layer 7 and the upper electrode layer 8.

Figure 9:
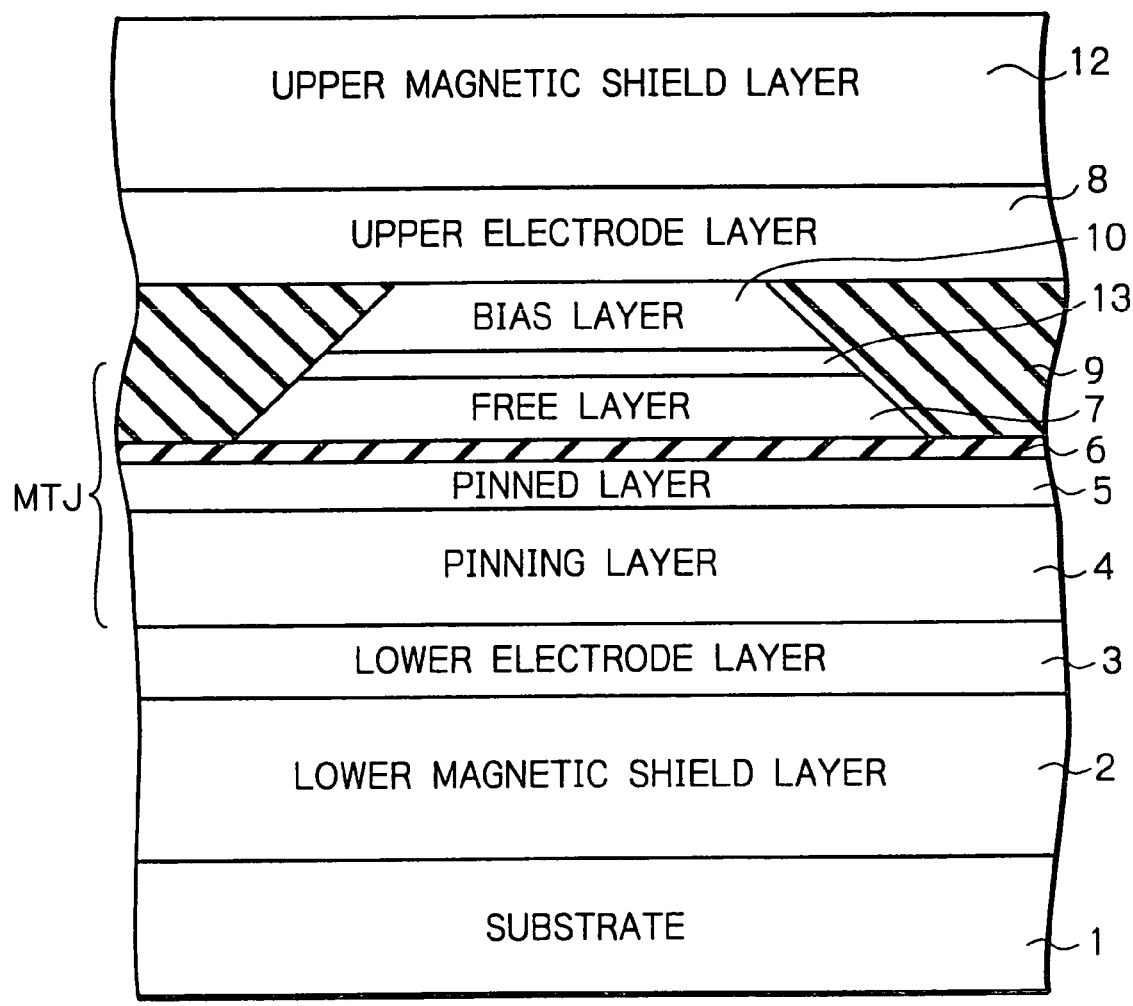
FIG. 9 is a cross-sectional, ABS view illustrating a fifth embodiment of the MTJ-type MR effect transducer according to the present invention.

In FIG. 9, which illustrates a fifth embodiment of the MTJ-type MR effect transducer according to the present invention, a lower magnetic shield layer 2, a lower electrode layer 3, a pinning layer 4, a pinned layer 5 and a barrier layer 6 are sequentially formed on a substrate 1.

Also, a patterned free layer 7, a patterned interface control layer 13 and a patterned longitudinal bias layer 10 are formed on the barrier layer 6. The interface control layer 13 is made of conductive material for controlling the bias magnetic field applied by the longitudinal bias layer 10 to the free layer 7.

Further, an insulating layer 9 is formed on sides of a mesa structure formed by the free layer 7, the interface control layer 13 and the longitudinal bias layer 10.

Additionally, an upper electrode layer 8 and an upper magnetic shield layer 12 are sequentially formed on the bias layer 10 and the insulating layer 9, thus completing the MTJ-type MR effect transducer of FIG. 9.

In the MTJ-type MR effect transducer of FIG. 9, a tunnel current flows from the lower electrode 3 via the pinning layer 4, the pinned layer 5, the barrier layer 6, the free layer 7, the interface control layer 13 and the longitudinal bias layer 10 to the upper electrode layer 8. In this case, the longitudinal bias layer 10 is made of insulating material, so that the tunnel current is hardly affected by the longitudinal bias layer 10.

In the MTJ-type MR effect transducer of FIG. 9, since the longitudinal bias layer 10 is connected via the interface layer 13 to the free layer 7, a longitudinal bias magnetic field can sufficiently be applied from the longitudinal bias layer 10 to the free layer 7.

In addition, in the MTJ-type MR effect transducer of FIG. 9, since the free layer 7 of the MTJ structure is patterned by a milling process but the pinned layer 5 and the barrier layer 6 of the MTJ structure are not patterned by the milling process, metal particles or contamination may not be adhered to the sides of barrier layer 6, so that the pinned layer 5 and the free layer 7 are hardly short-circuited. This would increase the manufacturing yield of MTJ-type MR effect transducers.

In FIG. 9, note that an insulating gap layer can be inserted between the lower magnetic shield layer 2 and the lower electrode layer 3, and an insulating gap layer can be inserted between the upper electrode layer 8 and the upper magnetic shield layer 12. Also, the lower magnetic shield layer 2 can serve as the lower electrode layer 3, and the upper magnetic shield layer 12 can serve as the upper electrode layer 8. Further, an underlayer can be inserted between the lower electrode layer 3 and the pinning layer 4, and an upper layer can be inserted between the longitudinal bias layer 10 and the upper electrode layer 8.

Figure 10:
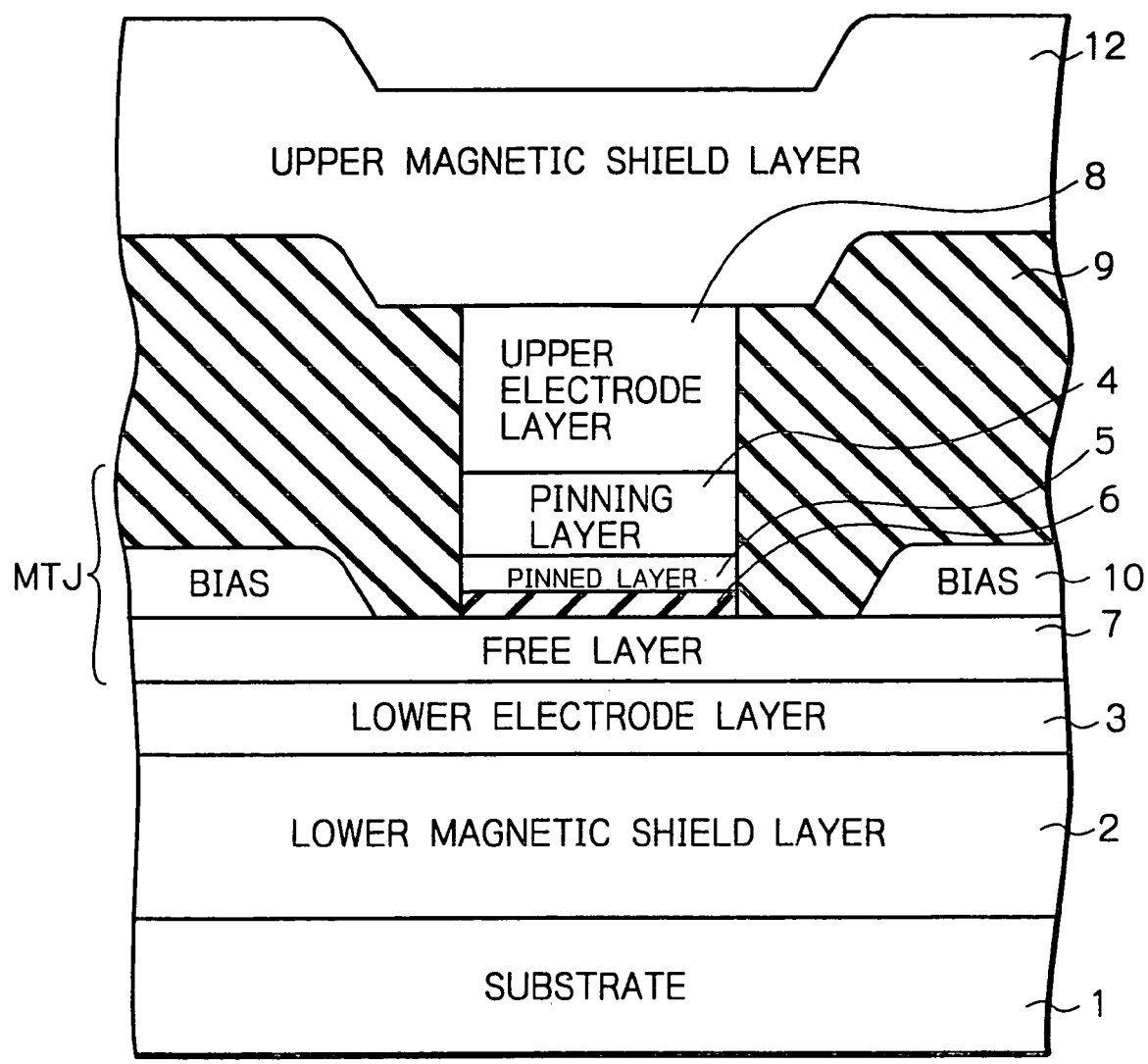
FIG. 10 is a cross-sectional, ABS view illustrating a sixth embodiment of the MTJ-type MR effect transducer according to the present invention.

In FIG. 10, which illustrates a sixth embodiment of the MTJ-type MR effect transducer according to the present invention, a lower magnetic shield layer 2, a lower electrode layer 3 and a free layer 7 are sequentially formed on a substrate 1.

Also, patterned longitudinal bias layers 10 are formed on the free layer 7. In addition, a patterned barrier layer 6, a patterned pinned layer 5, a patterned pinning layer 4 and a patterned upper electrode layer 8 are formed on the free layer 7.

Further, an insulating layer 9 is formed on sides of a cylindrical structure formed by the barrier layer 6, the pinned layer 5, the pinning layer 4 and the upper electrode layer 8.

Additionally, an upper magnetic shield layer 12 is formed on the upper electrode layer 8 and the insulating layer 9, thus completing the MTJ-type MR effect transducer of FIG. 10.

In the MTJ-type MR effect transducer of FIG. 10, a tunnel current flows from the lower electrode 3 via the free layer 7, the barrier layer 6, the pinned layer 5 and the pinning layer 4 to the upper electrode layer 8. In this case, since the longitudinal bias layers 10 deviate from the tunnel current, the tunnel current never flows from or to the longitudinal bias layers 10.

In the MTJ-type MR effect transducer of FIG. 10, since the longitudinal bias layers 10 are connected directly to the free layer 7, a sufficient longitudinal bias magnetic field can be applied from the longitudinal bias layers 10 to the free layer 7.

In the MTJ-type MR effect transducer of FIG. 10, however, since the pinning layer 4 and the pinned layer 5 as well as the barrier layer 6 is patterned by a milling process metal particles or contamination may be adhered to the sides of barrier layer 6.

In FIG. 10, note that an insulating gap layer can be inserted between the lower magnetic shield layer 2 and the lower electrode layer 3, and an insulating gap layer can be inserted between the upper electrode layer 8 and the upper magnetic shield layer 12. Also, the lower magnetic shield layer 2 can serve as the lower electrode layer 3, and the upper magnetic shield layer 12 can serve as the upper electrode layer 8. Further, an underlayer can be inserted between the lower electrode layer 3 and the free layer 7, and an upper layer can be inserted between the pinning layer 4 and the upper electrode layer 8.

Figure 11:
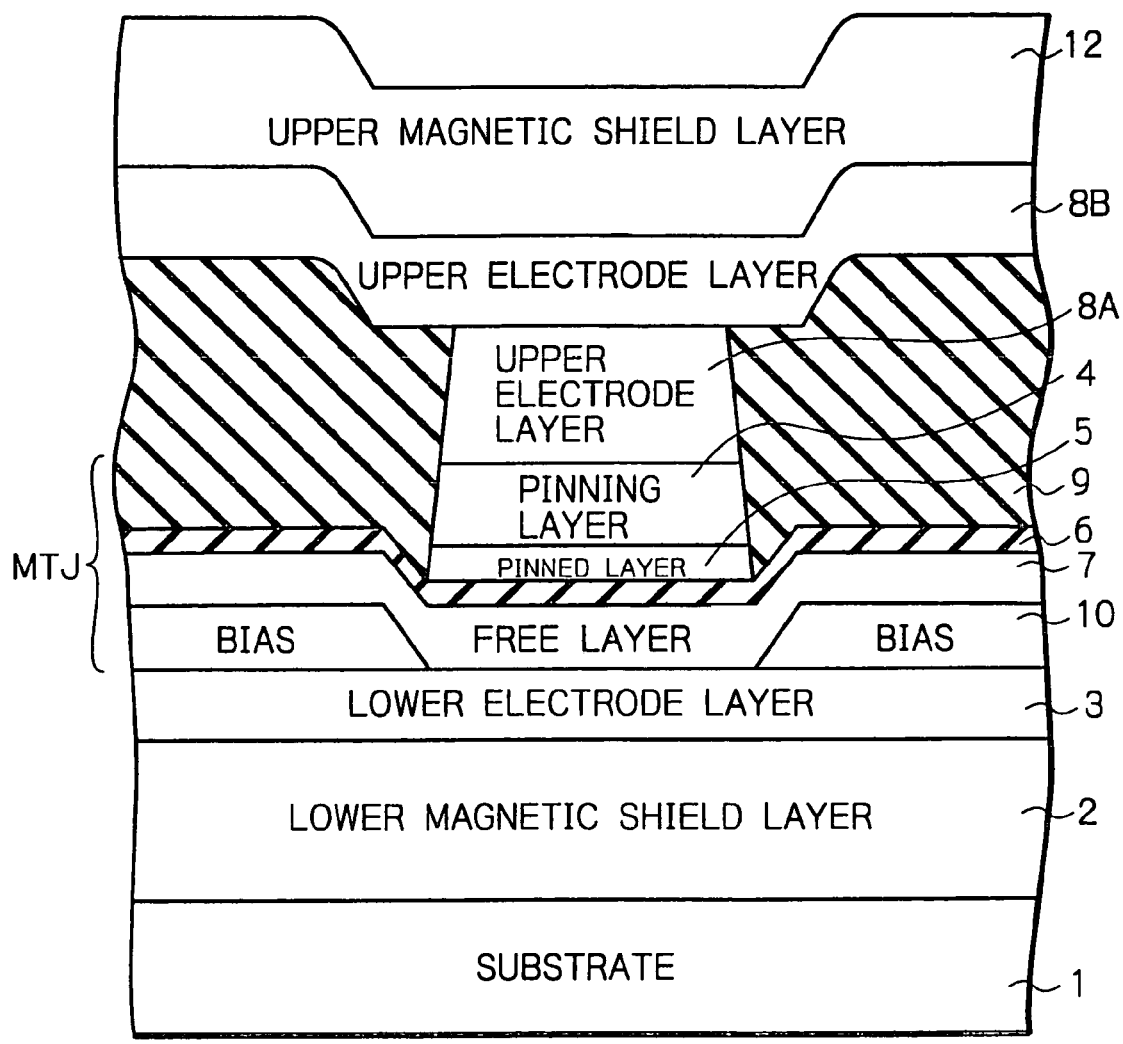
FIG. 11 is a cross-sectional, ABS view illustrating a seventh embodiment of the MTJ-type MR effect transducer according to the present invention.

In FIG. 11, which illustrates a seventh embodiment of the MTJ-type MR effect transducer according to the present invention, a lower magnetic shield layer 2 and a lower electrode layer 3 are sequentially formed on a substrate 1.

Also, patterned longitudinal bias layers 10 are formed on the lower electrode layer 3.

Additionally, a free layer 7 and a barrier layer 6 are sequentially formed on the longitudinal bias layers 10 and the lower electrode layer 3.

Further, a patterned pinned layer 5, a patterned pinning layer 4 and a patterned upper electrode layer 8A are formed on the barrier layer 6.

Further, an insulating layer 9 is formed on sides of a cylindrical structure formed by the pinned layer 5, the pinning layer 4 and the upper electrode layer 8A.

Additionally, an upper electrode layer 8B and an upper magnetic shield layer 12 are sequentially formed on the upper electrode layer 8A and the insulating layer 9, thus completing the MTJ-type MR effect transducer of FIG. 11.

In the MTJ-type MR effect transducer of FIG. 11, a tunnel current flows from the lower electrode 3 via the free layer 7, the barrier layer 6, the pinned layer 5 and the pinning layer 4 to the upper electrode layers 8A and 8B. In this case, since the longitudinal bias layers 10 deviate from the path of the tunnel current, the tunnel current never flows from or to the longitudinal bias layers 10.

In the MTJ-type MR effect transducer of FIG. 11, since the longitudinal bias layers 10 are connected directly to the free layer 7, a longitudinal bias magnetic field can sufficiently be applied from the longitudinal bias layers 10 to the free layer 7.

In addition, in the MTJ-type MR effect transducer of FIG. 11, since the pinned layer 5 of the MTJ structure is patterned by a milling process but the barrier layer 6 and the free layer 7 of the MTJ structure are not patterned by the milling process, metal particles or contamination may not be adhered to the sides of barrier layer 6, so that the pinned layer 5 and the free layer 7 are hardly short-circuited. This would increase the manufacturing yield of MTJ-type MR effect transducers.

In FIG. 11, note that an insulating gap layer can be inserted between the lower magnetic shield layer 2 and the lower electrode layer 3, and an insulating gap layer can be inserted between the upper electrode layer 8B and the upper magnetic shield layer 12. Also, the lower magnetic shield layer 2 can serve as the lower electrode layer 3, and the upper magnetic shield layer 12 can serve as the upper electrode layer 8B. Further, an underlayer can be inserted between the lower electrode layer 3 and the free layer 7, and an upper layer can be inserted between the pinning layer 4 and the upper electrode layer 8A.

Figure 12:
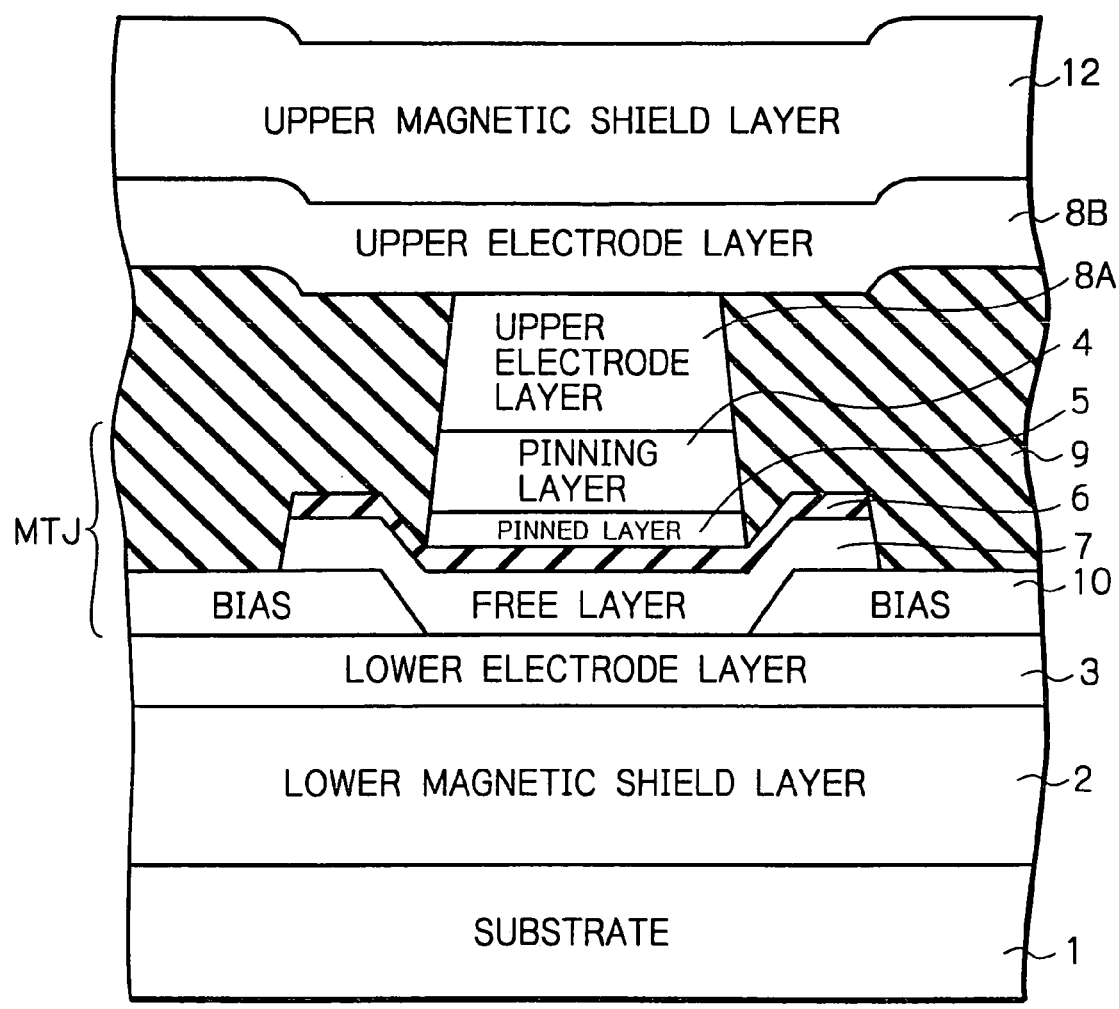
FIGS. 12 and 13 are cross-sectional, ABS views illustrating modifications of the MTJ-type MR effect transducer of FIG. 11.
Figure 13:
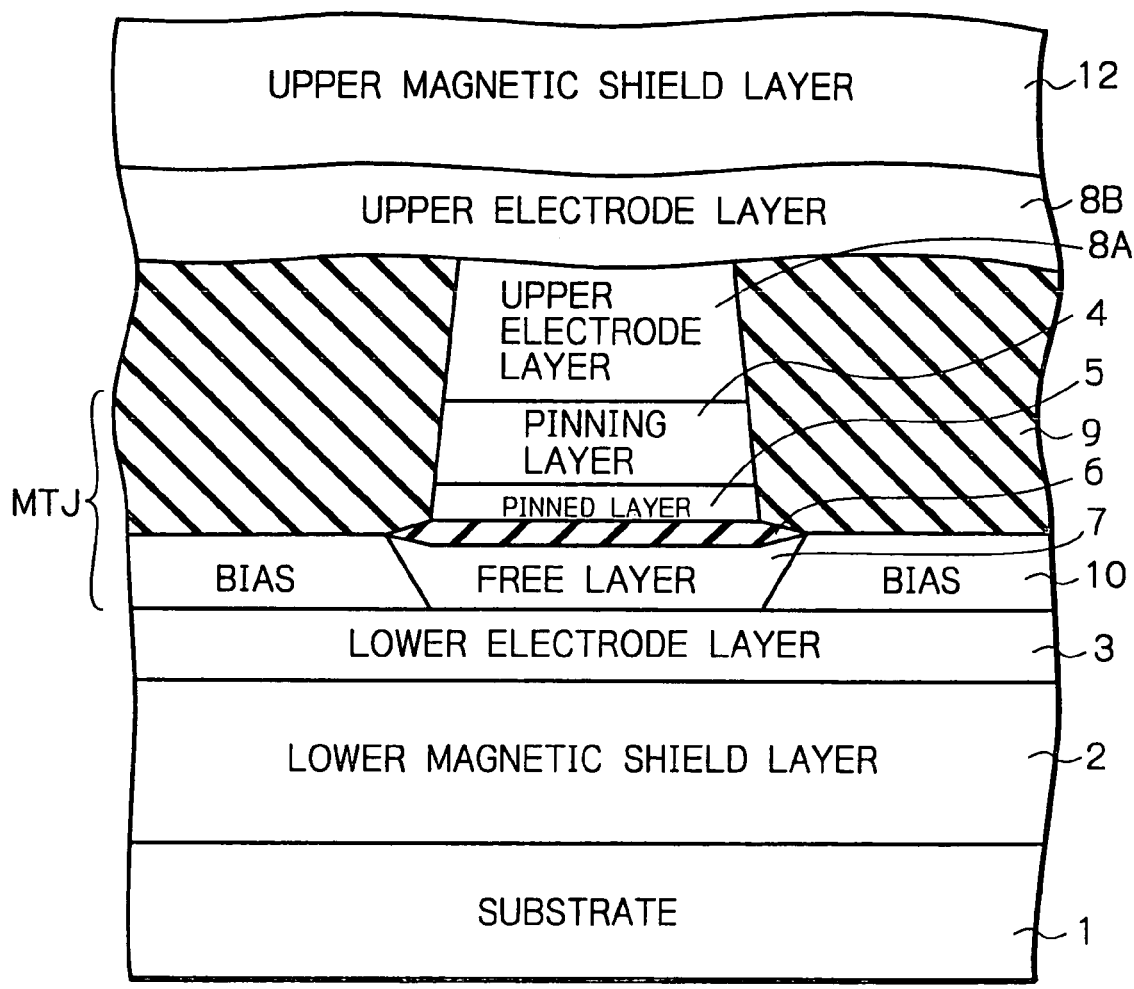

FIGS. 12 and 13 illustrate modifications of the MTJ-type MR effect transducer of FIG. 11, the free layer 7 and the barrier layer 6 are patterned by a milling process. In FIG. 12, the free layer 7 and the barrier layer 6 terminate at intermediate positions of the longitudinal bias layers 10. On the other hand, the free layer 7 and the barrier layer 6 terminate at the edges of the longitudinal bias layers 10. That is, the insulating layer 9, the upper electrode layer 8B and the upper magnetic shield layer 12 are flatter in FIGS. 12 and 13 than in FIG. 11. This would contribute to the accuracy of photolithography process, thus increasing the manufacturing yield. However, the fact that the barrier layer 6 and the free layer 7 are patterned by a milling process, is disadvantageous in terms of the manufacturing yield.

Figure 14:
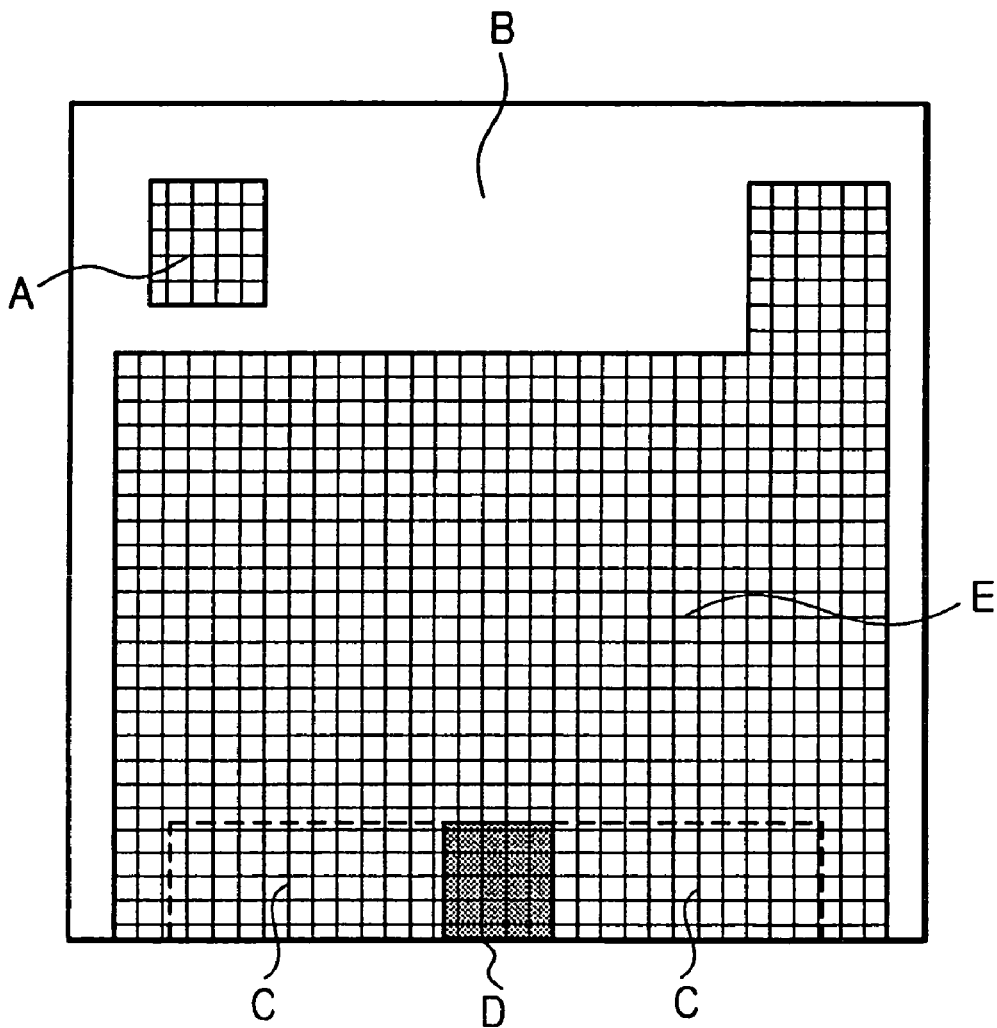
FIG. 14 is a plan view of the MTJ-type MR effect transducer of FIG. 5.

FIG. 14 is a plan view illustrating the MTJ-type MR effect transducer of FIG. 5. In FIG. 14, the substrate 1, the lower magnetic shield layer 2 and the lower electrode layer 3 are stacked in region A. The substrate 1, the lower magnetic shield layer 2, the lower electrode layer 3, the pinning layer 4, the pinned layer 5 and the barrier layer 6 are stacked in region B. The substrate 1, the lower magnetic shield layer 2, the lower electrode layer 3, the pinning layer 4, the pinned layer 5, the barrier layer 6, the free layer 7, the longitudinal bias layer 10, the insulating layer 9, the upper electrode layer 8 and the upper magnetic shield layer 12 are stacked in region C. The substrate 1, the lower magnetic shield layer 2, the lower electrode layer 3, the pinning layer 4, the pinned layer 5, the barrier layer 6, the free layer 7, the upper electrode layer 8 and the upper magnetic shield layer 12 are stacked in region D. The substrate 1, the lower magnetic shield layer 2, the lower electrode layer 3, the pinning layer 4, the pinned layer 5, the barrier layer 6, the insulating layer 9, the upper electrode layer 8 and the upper magnetic shield layer 12 are stacked in region E.

Figure 15:
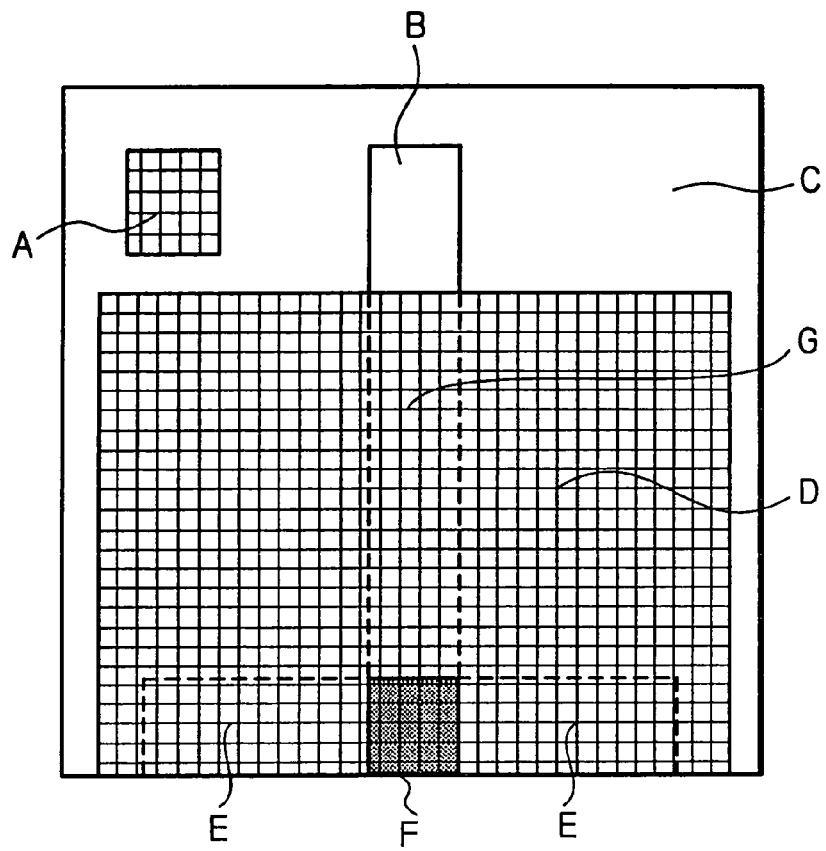
FIG. 15 is a plan view of the MTJ-type MR effect transducer of FIG. 6.

FIG. 15 is a plan view illustrating the MTJ-type MR effect transducer of FIG. 6. In FIG. 15, the substrate 1, the lower magnetic shield layer 2 and the lower electrode layer 3 are stacked in region A. The substrate 1, the lower magnetic shield layer 2, the lower electrode layer 3, the pinning layer 4, the pinned layer 5, the barrier layer 6, the insulating layer (not shown in FIG. 6) and the upper electrode layer 8 are stacked in region B. The substrate 1, the lower magnetic shield layer 2, the lower electrode layer 3, the pinning layer 4, the pinned layer 5, the barrier layer 6 and the insulating layer are stacked in region C. The substrate 1, the lower magnetic shield layer 2, the lower electrode layer 3, the pinning layer 4, the pinned layer 5, the barrier layer 6, the insulating layer and the upper shield layer 12 are stacked in region D. The substrate 1, the lower magnetic shield layer 2, the lower electrode layer 3, the pinning layer 4, the pinned layer 5, the barrier layer 6, the insulating layer, the free layer 7, the longitudinal bias layer 10 and the upper shield layer 12 are stacked in region E. The substrate 1, the lower magnetic shield layer 2, the lower electrode layer 3, the pinning layer 4, the pinned layer 5, the barrier layer 6, the insulating layer, the free layer 7, the upper electrode layer 8, the longitudinal bias layer 10 and the upper shield layer 12 are stacked in region F. The substrate 1, the lower magnetic shield layer 2, the lower electrode layer 3, the pinning layer 4, the pinned layer 5, the barrier layer 6, the insulating layer, the upper electrode layer 8 and the upper shield layer 12 are stacked in region G.

Figure 16:
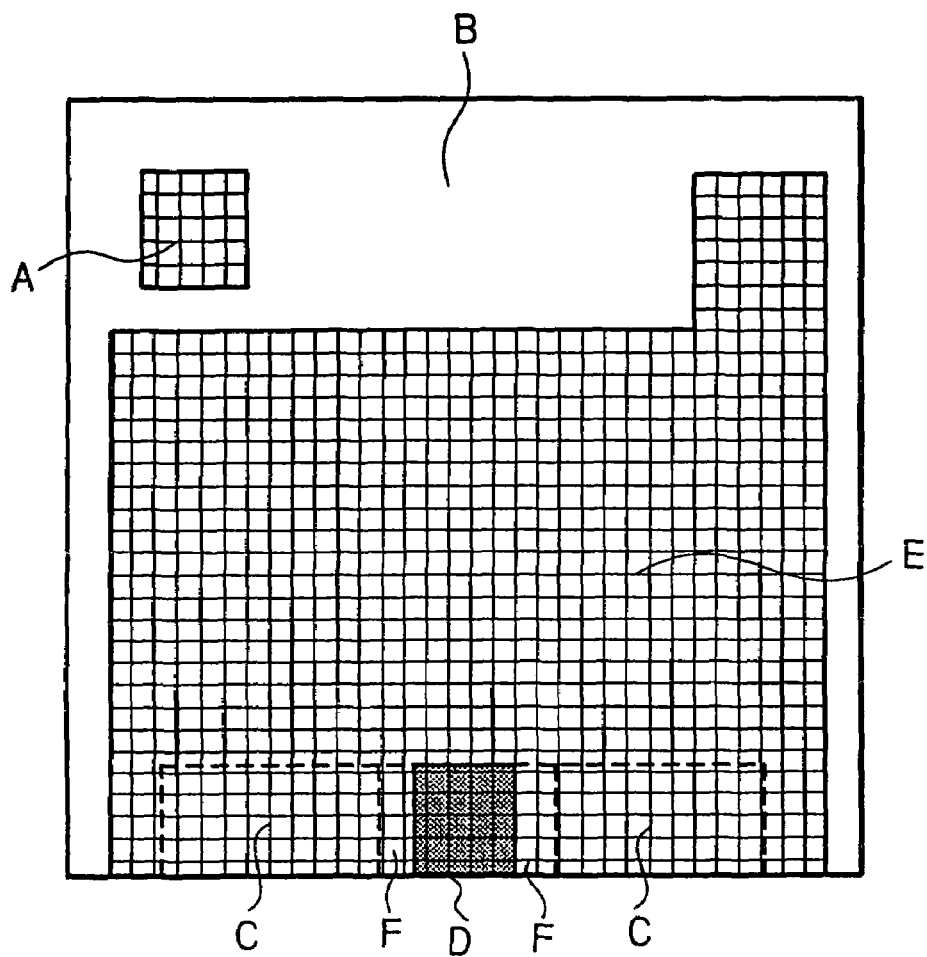
FIG. 16 is a plan view of the MTJ-type MR effect transducer of FIG. 7.

FIG. 16 is a plan view illustrating the MTJ-type MR effect transducer of FIG. 7. In FIG. 16, the substrate 1, the lower magnetic shield layer 2 and the lower electrode layer 3 are stacked in region A. The substrate 1, the lower magnetic shield layer 2, the lower electrode layer 3, the pinning layer 4, the pinned layer 5, the barrier layer 6 and the insulating layer 9 are stacked in region B. The substrate 1, the lower magnetic shield layer 2, the lower electrode layer 3, the pinning layer 4, the pinned layer 5, the barrier layer 6, the insulating layer 9, the longitudinal bias layer 10, the upper electrode layer 8 and the upper magnetic shield layer 12 are stacked in region C. The substrate 1, the lower magnetic shield layer 2, the lower electrode layer 3, the pinning layer 4, the pinned layer 5, the barrier layer 6, the free layer 7, the upper electrode layer 8 and the upper magnetic shield layer 12 are stacked in region D. The substrate 1, the lower magnetic shield layer 2, the lower electrode layer 3, the pinning layer 4, the pinned layer 5, the barrier layer 6, the insulating layer 9, the upper electrode layer 8 and the upper magnetic shield layer 12 are stacked in region E. The substrate 1, the lower magnetic shield layer 2, the lower electrode layer 3, the pinning layer 4, the pinned layer 5, the barrier layer 6, the free layer 7, the insulating layer 9, the longitudinal bias layer 10, the upper electrode layer 8 and the upper magnetic shield layer 12 are stacked in region F.

Figure 17:
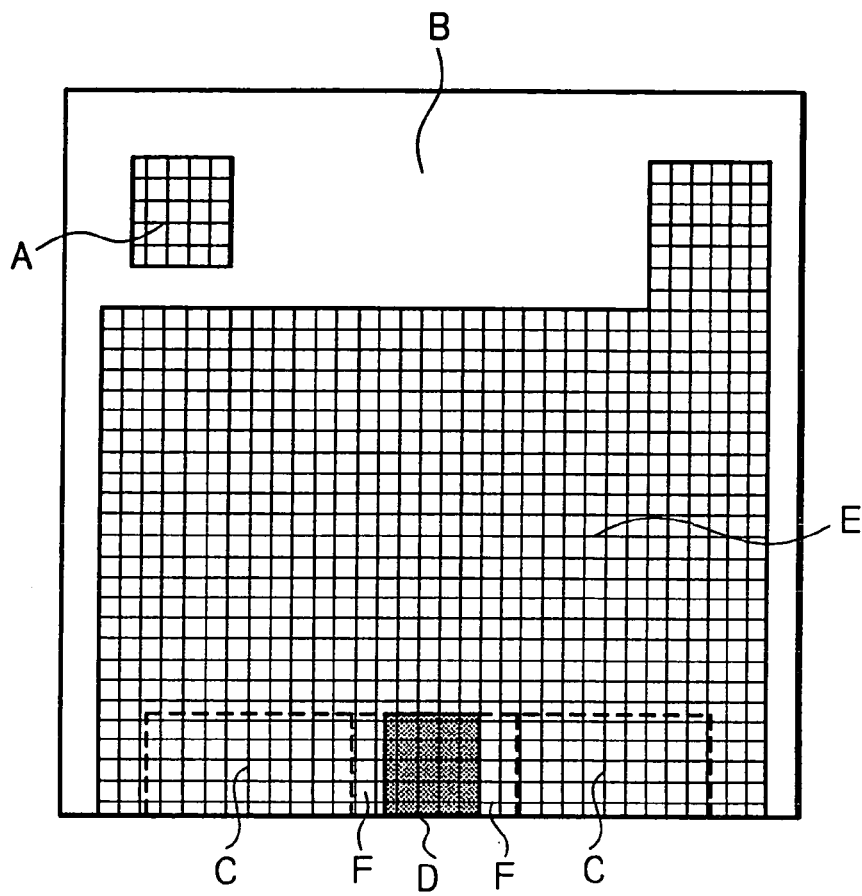
FIG. 17 is a plan view of the MTJ-type MR effect transducer of FIG. 8.

FIG. 17 is a plan view illustrating the MTJ-type MR effect transducer of FIG. 8. In FIG. 17, the substrate 1, the lower magnetic shield layer 2 and the lower electrode layer 3 are stacked in region A. The substrate 1, the lower magnetic shield layer 2, the lower electrode layer 3, the pinning layer 4, the pinned layer 5, the barrier layer 6 and the insulating layer (not shown) are stacked in region B. The substrate 1, the lower magnetic shield layer 2, the lower electrode layer 3, the pinning layer 4, the pinned layer 5, the barrier layer 6, the longitudinal bias layer 10, the upper electrode layer 8 and the upper magnetic shield layer 12 are stacked in region C. The substrate 1, the lower magnetic shield layer 2, the lower electrode layer 3, the pinning layer 4, the pinned layer 5, the barrier layer 6, the free layer 7, the upper electrode layer 8 and the upper magnetic shield layer 12 are stacked in region D. The substrate 1, the lower magnetic shield layer 2, the lower electrode layer 3, the pinning layer 4, the pinned layer 5, the barrier layer 6, the insulating layer (not shown), the upper electrode layer 8 and the upper magnetic shield layer 12 are stacked in region E. The substrate 1, the lower magnetic shield layer 2, the lower electrode layer 3, the pinning layer 4, the pinned layer 5, the barrier layer 6, the free layer 7, the longitudinal bias layer 10, the upper electrode layer 8 and the upper magnetic shield layer 12 are stacked in region F.

Figure 18:
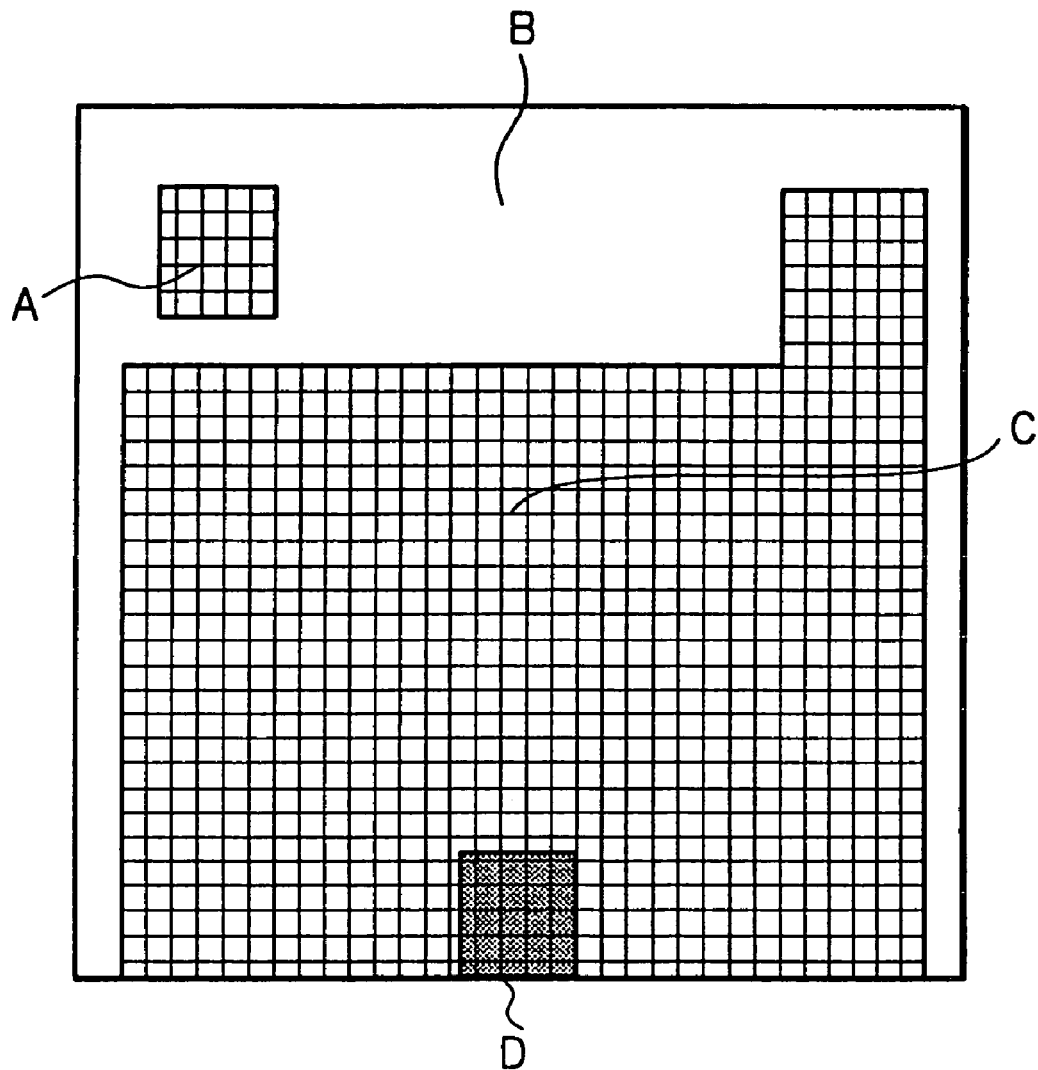
FIG. 18 is a plan view of the MTJ-type MR effect transducer of FIG. 9.

FIG. 18 is a plan view illustrating the MTJ-type MR effect transducer of FIG. 9. In FIG. 18, the substrate 1, the lower magnetic shield layer 2 and the lower electrode layer 3 are stacked in region A. The substrate 1, the lower magnetic shield layer 2, the lower electrode layer 3, the pinning layer 4, the pinned layer 5, the barrier layer 6 and the insulating layer 9 are stacked in region B. The substrate 1, the lower magnetic shield layer 2, the lower electrode layer 3, the pinning layer 4, the pinned layer 5, the barrier layer 6, the insulating layer 9, the upper electrode layer 8 and the upper magnetic shield layer 12 are stacked in region C. The substrate 1, the lower magnetic shield layer 2, the lower electrode layer 3, the pinning layer 4, the pinned layer 5, the barrier layer 6, the free layer 7, the interface control layer 13, the longitudinal bias layer 10, the upper electrode layer 8 and the upper magnetic shield layer 12 are stacked in region D.

Figure 19:
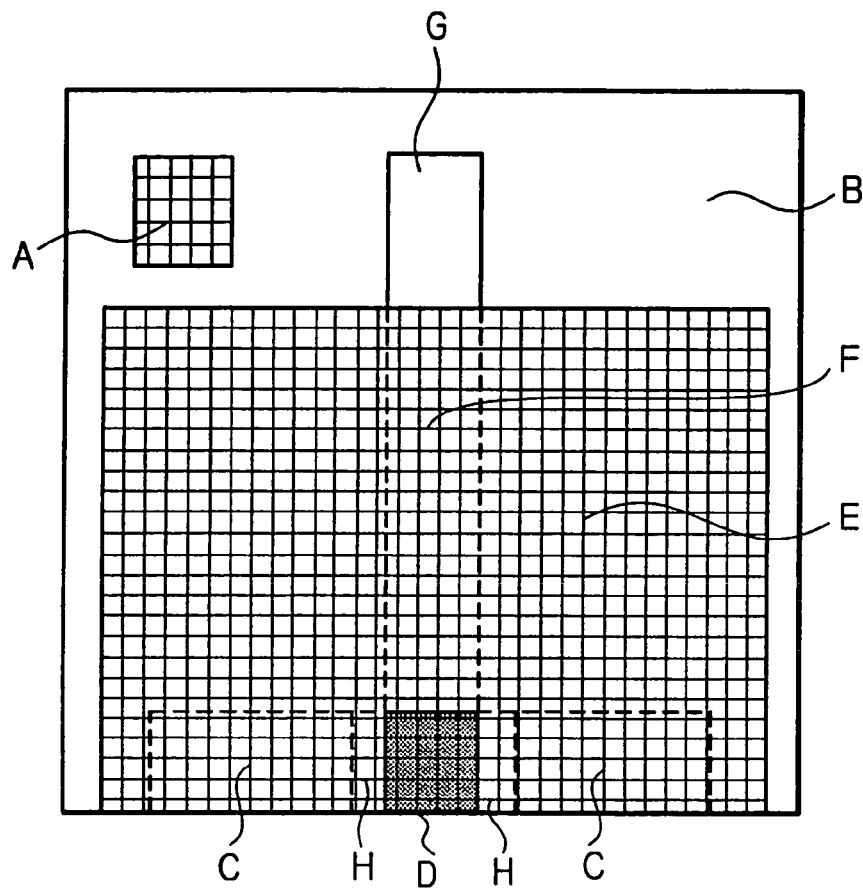
FIG. 19 is a plan view of the MTJ-type MR effect transducer of FIG. 10.

FIG. 19 is a plan view illustrating the MTJ-type MR effect transducer of FIG. 10. In FIG. 19, the substrate 1, the lower magnetic shield layer 2 and the lower electrode layer 3 are stacked in region A. The substrate 1, the lower magnetic shield layer 2, the lower electrode layer 3, the free layer 7, the barrier layer 6 and the insulating layer 9 are stacked in region B. The substrate 1, the lower magnetic shield layer 2, the lower electrode layer 3, the free layer 7, the longitudinal bias layer 10, the insulating layer 9 and the upper magnetic shield layer 12 are stacked in region C. The substrate 1, the lower magnetic shield layer 2, the lower electrode layer 3, the free layer 7, the barrier layer 6, the pinned layer 5, the pinning layer 4, the upper electrode layer 8 and the upper magnetic shield layer 12 are stacked in region D. The substrate 1, the lower magnetic shield layer 2, the lower electrode layer 3, the free layer 7, the barrier layer 6, the insulating layer 9 and the upper magnetic shield layer 12 are stacked in region E. The substrate 1, the lower magnetic shield layer 2, the lower electrode layer 3, the free layer 7, the barrier layer 6, the insulating layer 9, the upper electrode layer 8 and the upper magnetic shield layer 12 are stacked in region F. The substrate 1, the lower magnetic shield layer 2, the lower electrode layer 3, the free layer 7, the barrier layer 6, the insulating layer 9 and the upper electrode layer 8 are stacked in region G. The substrate 1, the lower magnetic shield layer 2, the lower electrode layer 3, the free layer 7, the insulating layer 9 and the upper magnetic shield layer 12 are stacked in region H.

Figure 20:
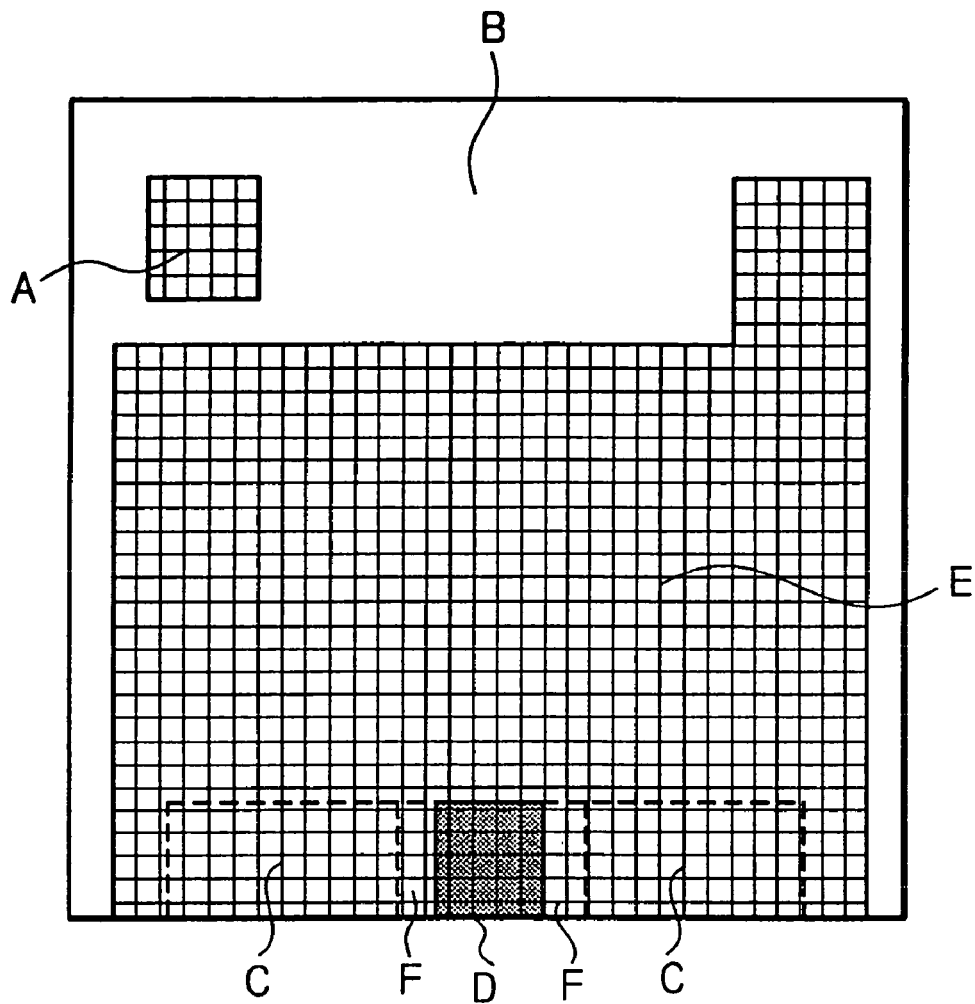
FIG. 20 is a plan view of the MTJ-type MR effect transducer of FIG. 11.

FIG. 20 is a plan view illustrating the MTJ-type MR effect transducer of FIG. 11. In FIG. 20, the substrate 1, the lower magnetic shield layer 2 and the lower electrode layer 3 are stacked in region A. The substrate 1, the lower magnetic shield layer 2, the free layer 7, the barrier layer 6 and the insulating layer 9 are stacked in region B. The substrate 1, the lower magnetic shield layer 2, the lower electrode layer 3, the longitudinal bias layer 10, the free layer 7, the bias layer 6, the insulating layer 9, the upper electrode layer 8 and the upper magnetic shield layer 12 are stacked in region C. The substrate 1, the lower magnetic shield layer 2, the lower electrode layer 3, the free layer 7, the barrier layer 6, the pinned layer 5, the pinning layer 4, the upper electrode layer 8 and the upper magnetic shield layer 12 are stacked in region D. The substrate 1, the lower magnetic shield layer 2, the lower electrode layer 3, the free layer 7, the barrier layer 6, the insulating layer 9, the upper electrode layer 8 and the upper magnetic shield layer 12 are stacked in region E. The substrate 1, the lower magnetic shield layer 2, the lower electrode layer 3, the free layer 7, the barrier layer 6, the insulating layer 9, the upper electrode layer 8 and the upper magnetic shield layer 12 are stacked in region F.

The materials of the substrate 1 and the layers 2 through 13 are explained next.

The substrate 1 is made of $Al_2O_3 \cdot TiC$, SiC, alumina, $Al_2O_3 \cdot TiC$/alumina or SiC/alumina.

Each of the lower magnetic shield layer 2 and the upper magnetic shield layer 12 is a single layer, a multilayer or a compound layer made of NiFe, CoZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi alloy, FeAlSi, iron nitride, MnZn ferrite, NiZn ferrite and/or MgZn ferrite.

Each of the lower electrode layer 3 and the upper electrode layer 8 is a single layer, a multilayer or a compound layer made of Au, Ag, Cu, Mo, W, Y, Ti, Zr, Hf, V, Nb and/or Ta.

The pinning layer 4 is made of FeMn, NiMn, IrMn, RhMn, PtPdMn, ReMn, PtMn, PtCrMn, CrMn, CrAl, TbCo, Ni oxide, Fe oxide, Ni oxide/Co oxide, Ni oxide/Co oxide, Ni oxide/Fe oxide, CoCr, CoCrPt, CoCrTa or PtCo. Also, Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti or Ta can be introduced into PtMn.

The pinned layer 5 is an alloy layer or an amorphous magnetic layer made of NiFe, CoFe, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb or CoZrMoNi.

In the above-described embodiments, since a magnetoresistive structure uses an insulating layer as a non-magnetic material, the barrier layer 6, is a single layer, a multilayer or a compound layer made of oxide, nitride, oxide/nitride, metal/oxide, metal/nitride or metal/oxide/nitride. For example, a single layer made of Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti, Ta, Pt, Ni, Co, Re or V, or their multilayers or their compound layers can be used for the barrier layer 6.

On the other hand, the above-mentioned embodiments can be applied to a spin value structure type. In this case, since a magnetoresistive structure uses a conductive layer as a non-magnetic material the conductive layer is a single layer, a multilayer or a compound layer made of Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti, Ta, Pt, Ni, Co, Re and/or V.

The free layer 7 is made of alloy or amorphous magnetic material such as NiFe, CoFe, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, CoZrMoNi.

The insulating layer 9 is a single layer, a multi layer or a compound layer made of aluminum oxide, silicon oxide, silicon nitride and/or diamond-like carbon.

The longitudinal bias layer 10 is a single layer, a multilayer or a compound layer made of CoCrPt, CoCr, CoPt, CoCrTa, FeMn, NiMn, Ni oxide, NiCo oxide, Fe oxide, NiFe oxide, IrMn, PtMn, PtPdMn, ReMn, Co ferrite and/or Ba ferrite.

The interface control layer 13 is a single layer, a multilayer or a compound layer made of aluminum oxide, silicon oxide, aluminum nitride, silicon nitride, diamond-like carbon, Au, Ag, Cu, Mo, W, Y, Ti, Zr, Hf, V, Nb and/or Ta.

The insulating gap layer is a single layer, a multi layer or a compound layer made of aluminum oxide, silicon oxide, aluminum nitride, silicon nitride and/or diamond-like carbon.

Each of the underlayer and the upper layer is a single layer, a multi layer or a compound layer made of oxides and nitrides of Ta, Hf, Zr, W, Cr, Ti, Mo, Pt, Ni, Ir, Cu, Ag, Co, Zn, Ru, Rh, Re, Au, Os, Pd, Nb and/or V. Also, Ta, Hf, Zr, W, Cr, Ti, Mo, Pt, Ni, Ir, Cu, Ag, Co, Zn, Ru, Rh, Re, Au, Os, Pd, Nb, V can be introduced into the oxides and nitrides.

The method for manufacturing the MTJ-type MR effect transducer of FIGS. 5 and 14 is explained next with reference to FIGS. 21A through 21H.

Figure 21A:
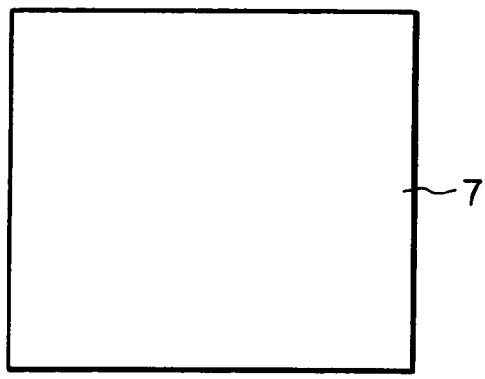
FIGS. 21A through 21H are plan views for explaining the method for manufacturing the MTJ-type MR effect transducer of FIGS. 5 and 14.

First, referring to FIG. 21A, a lower magnetic shield layer 2, a lower electrode layer 3, a pinning layer 4, a pinned layer 5, a barrier layer 6 and a free layer 7 are sequentially formed on a substrate 1.

Figure 21B:
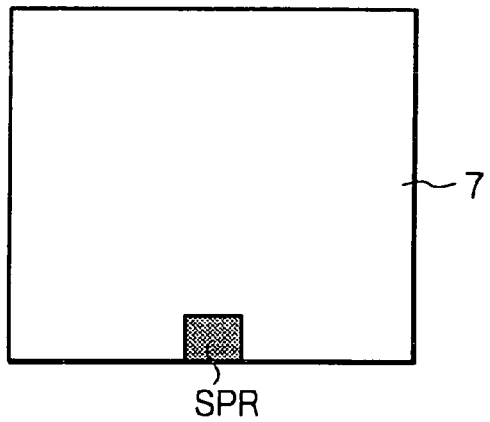

Next, referring to FIG. 21B, a stencil photoresist mask SPR is formed on the free layer 7.

Figure 21C:
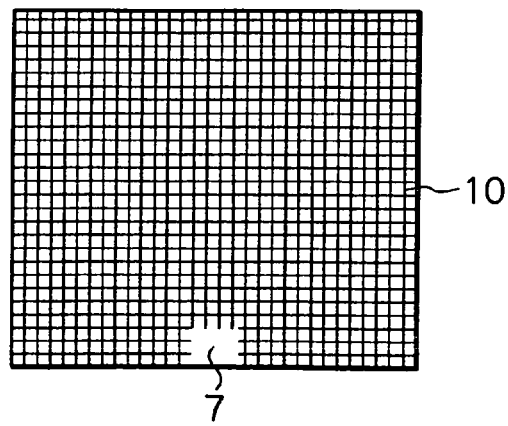

Next, referring to FIG. 21C, a longitudinal bias layer 10 is formed thereon, and then, the longitudinal bias layer 10 on the stencil photoresist mask SPR is lifted off.

Figure 21D:
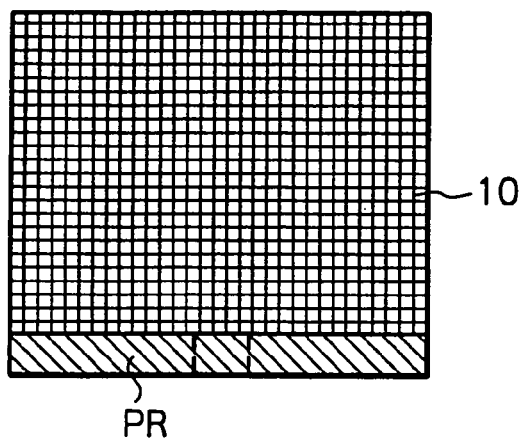

Next, referring to FIG. 21D, a photoresist pattern PR is formed.

Figure 21E:
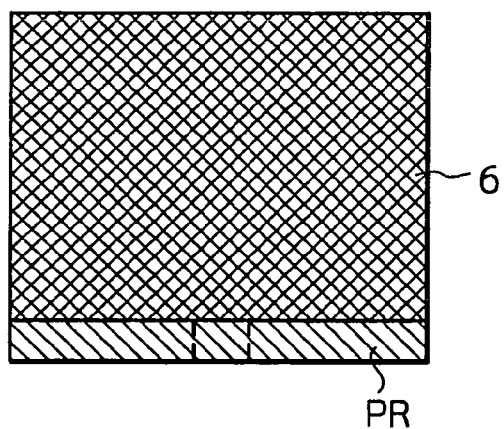

Next, referring to FIG. 21E, the longitudinal bias layer 10 is patterned by a milling process to expose the barrier layer 6.

Figure 21F:
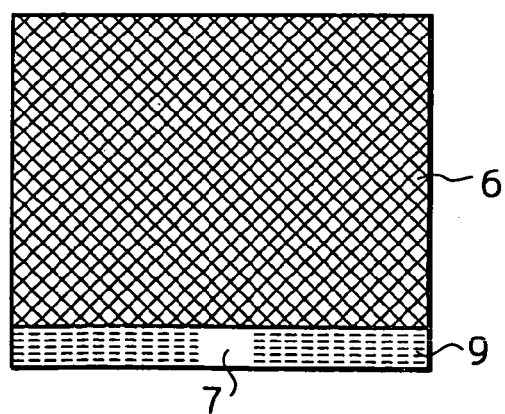

Next, referring to FIG. 21F, an insulating layer 9 is formed, and the insulating layer 9 on the photoresist pattern PR is lifted off.

Figure 21G:
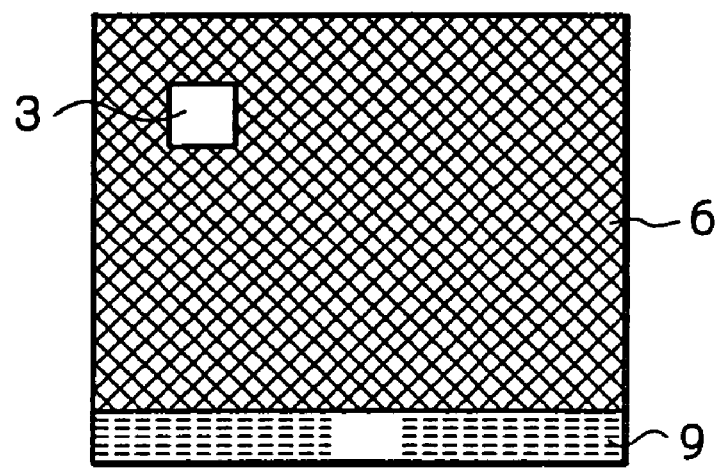

Next, referring to FIG. 21G, the insulating layer 9 is further etched to expose the lower electrode layer 3.

Figure 21H:
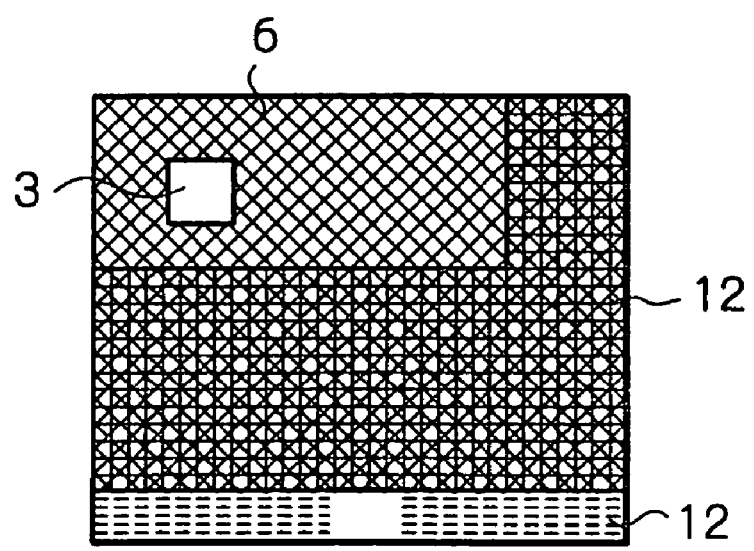

Finally, referring to FIG. 21H, an upper electrode layer 8 and an upper magnetic shield layer 12 are formed.

The method for manufacturing the MTJ-type MR effect transducer of FIGS. 6 and 15 is explained next with reference to FIGS. 22A through 22H.

Figure 22A:
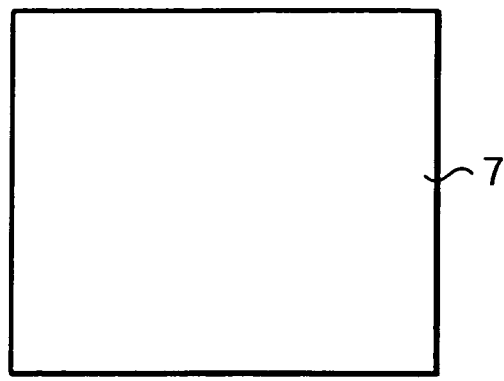
FIGS. 22A through 22H are plan views for explaining the method for manufacturing the MTJ-type MR effect transducer of FIGS. 6 and 15.

First, referring to FIG. 22A, a lower magnetic shield layer 2, a lower electrode layer 3, a pinning layer 4, a pinned layer 5, a barrier layer 6 and a free layer 7 are sequentially formed on a substrate 1.

Figure 22B:
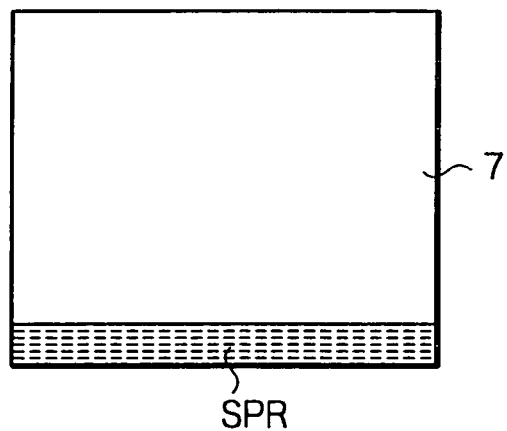

Next, referring to FIG. 22B, a stencil photoresist mask SPR is formed on the free layer 7.

Figure 22C:
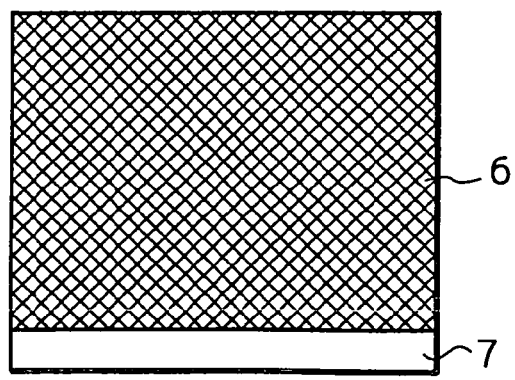

Next, referring to FIG. 22C, the free layer 7 is patterned by a milling process. Then, an insulating layer is formed, and the insulating layer on the stencil photoresist mask SPR is lifted off.

Figure 22D:
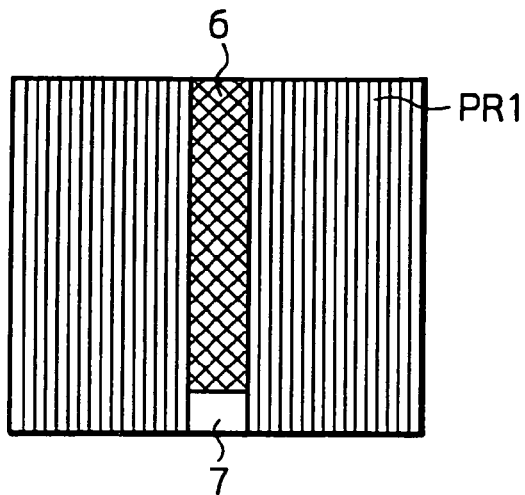

Next, referring to FIG. 22D, a photoresist pattern PR1 is formed.

Figure 22E:
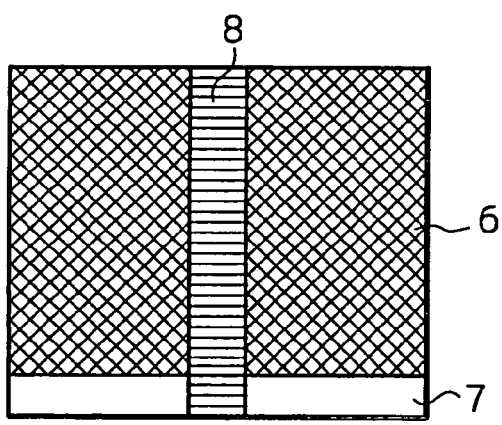

Next, referring to FIG. 22E, an upper electrode layer 8 is formed, and the upper electrode layer 8 on the photoresist pattern PR1 is lifted off.

Figure 22F:
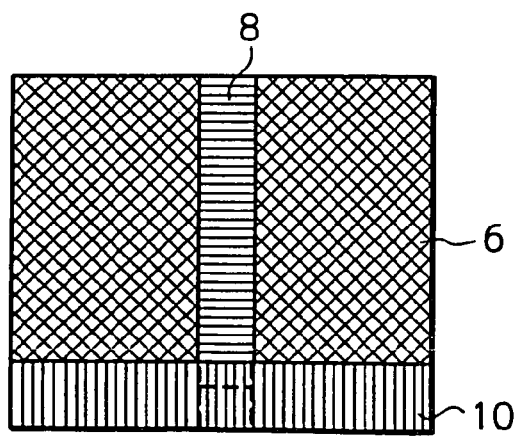

Next, referring to FIG. 22F, a photoresist pattern PR2 (not shown) is formed. Then, a longitudinal bias layer 10 and an insulating layer (not shown) are formed, and the insulating layer and the longitudinal bias layer 10 on the photoresist pattern PR2 are lifted off.

Figure 22G:
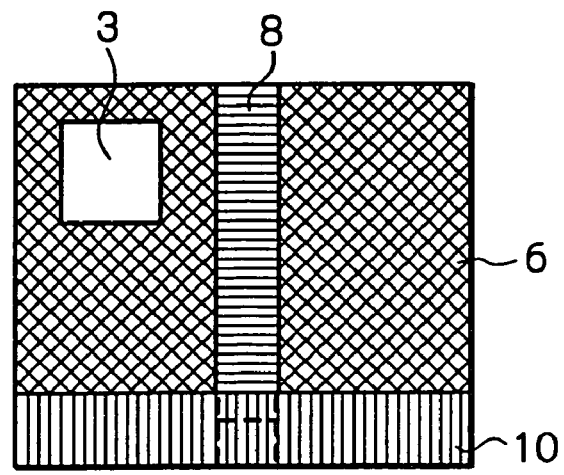

Next, referring to FIG. 22G, the insulating layer is further etched to expose the lower electrode layer 3.

Figure 22H:
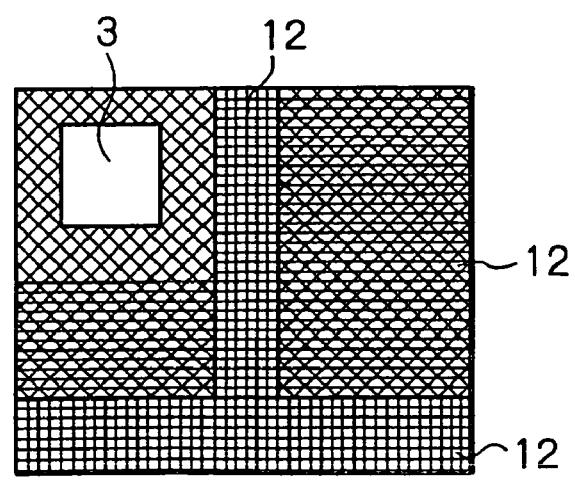

Finally, referring to FIG. 22H, an upper magnetic shield layer 12 is formed.

The method for manufacturing the MTJ-type MR effect transducer of FIGS. 7 and 16 is explained next with reference to FIGS. 23A through 23H.

Figure 23A:
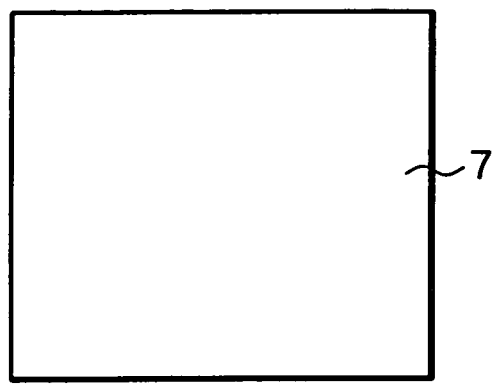
FIGS. 23A through 23H are plan views for explaining the method for manufacturing the MTJ-type MR effect transducer of FIGS. 7 and 16.

First, referring to FIG. 23A, a lower magnetic shield layer 2, a lower electrode layer 3, a pinning layer 4, a pinned layer 5, a barrier layer 6 and a free layer 7 are sequentially formed on a substrate 1.

Figure 23B:
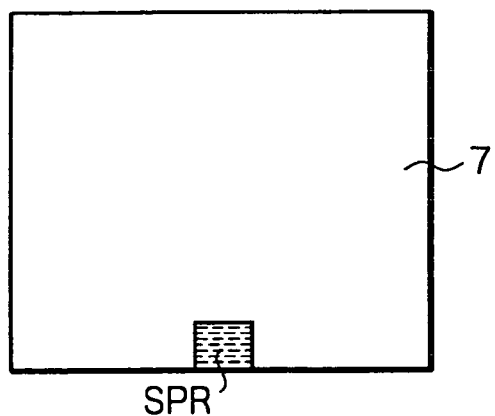

Next, referring to FIG. 23B, a stencil photoresist mask SPR is formed on the free layer 7.

Figure 23C:
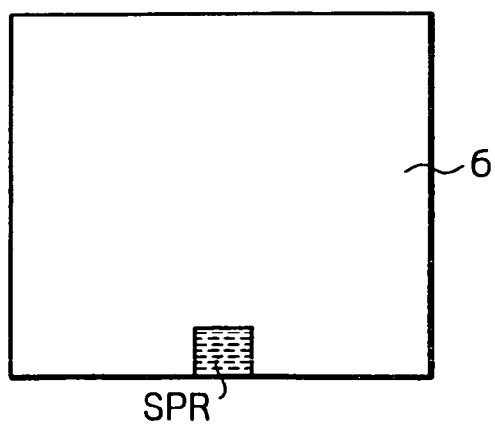

Next, referring to FIG. 23C, the free layer 7 is patterned by a milling process to expose the barrier layer 6.

Figure 23D:
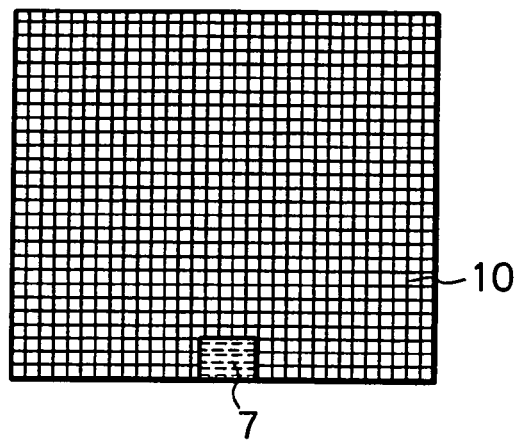

Next, referring to FIG. 23D, an insulating layer 9 and a longitudinal bias layer 10 are formed thereon, and then, the longitudinal bias layer 10 and the insulating layer 9 on the stencil photoresist mask SPR are lifted off.

Figure 23E:
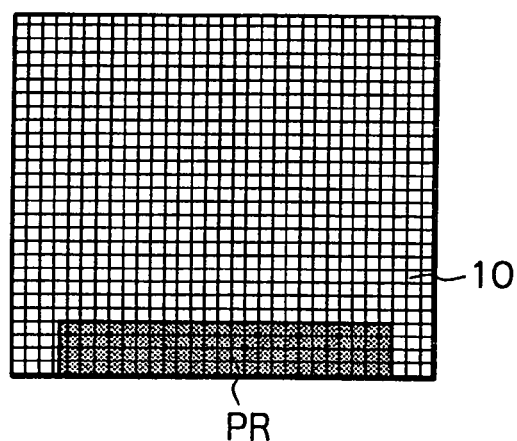

Next, referring to FIG. 23E, a photoresist pattern PR is formed.

Figure 23F:
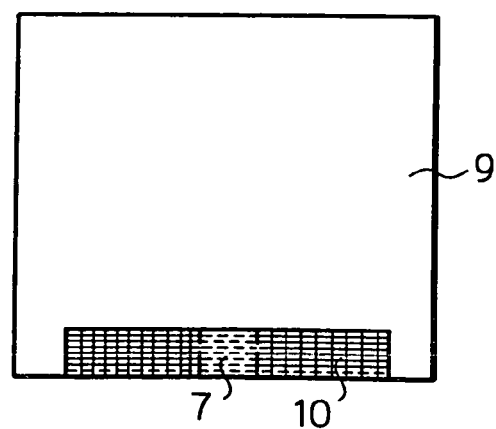

Next, referring to FIG. 23F, the longitudinal bias layer 10 is patterned by a milling process to expose the insulating layer 9. Then, the photoresist pattern PR is removed.

Figure 23G:
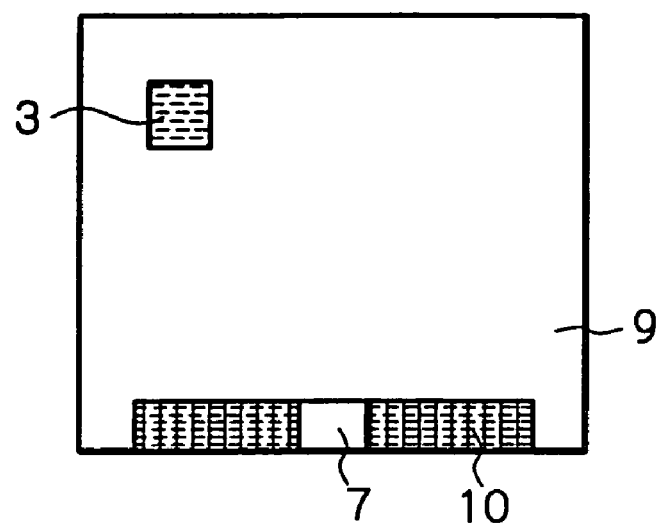

Next, referring to FIG. 23G, the insulating layer 9 is further etched to expose the lower electrode layer 3.

Figure 23H:
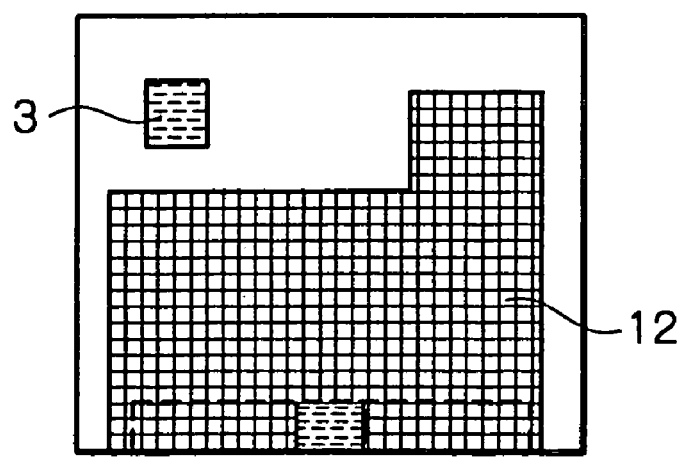

Finally, referring to FIG. 23H, an upper electrode layer 8 and an upper magnetic shield layer 12 are formed.

The method for manufacturing the MTJ-type MR effect transducer of FIGS. 8 and 17 is explained next with reference to FIGS. 24A through 24H.

Figure 24A:
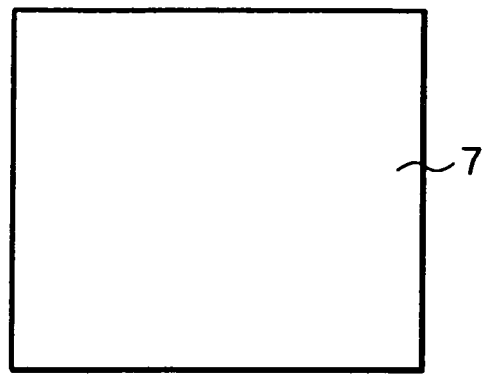
FIGS. 24A through 24H are plan views for explaining the method for manufacturing the MTJ-type MR effect transducer of FIGS. 8 and 17.

First, referring to FIG. 24A, a lower magnetic shield layer 2, a lower electrode layer 3, a pinning layer 4, a pinned layer 5, a barrier layer 6 and a free layer 7 are sequentially formed on a substrate 1.

Figure 24B:
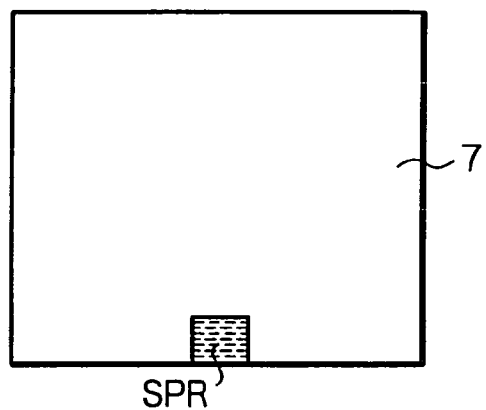

Next, referring to FIG. 24B, a stencil photoresist mask SPR is formed on the free layer 7.

Figure 24C:
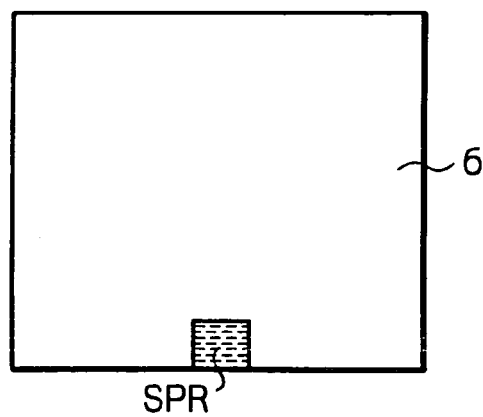

Next, referring to FIG. 24C, the free layer 7 is patterned by a milling process to expose the barrier layer 6.

Figure 24D:
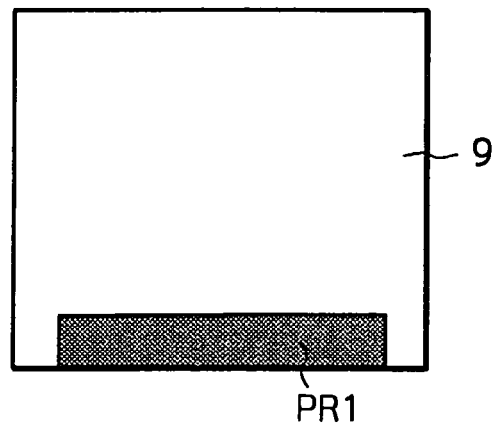

Next, referring to FIG. 24D, a photoresist pattern PR1 is formed, and then, an insulating layer 9 is formed thereon. Then, the insulating layer 9 on the photoresist mask PR are lifted off. Then, the photoresist mask PR1 is removed.

Figure 24E:
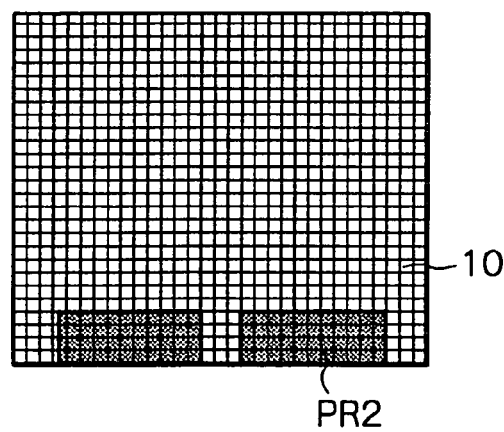

Next, referring to FIG. 24E, a longitudinal bias layer 10 is formed, and then, a photoresist pattern PR2 is formed thereon.

Figure 24F:
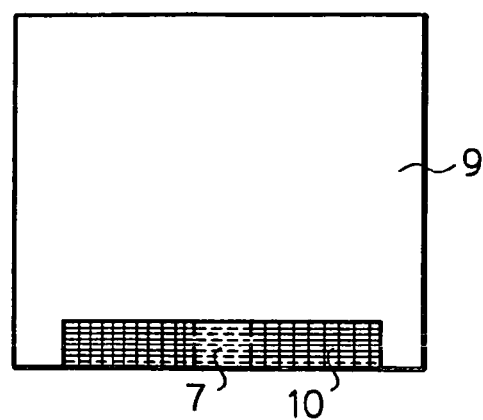

Next, referring to FIG. 24F, the longitudinal bias layer 10 is patterned by a milling process to expose the insulating layer 9. Then, the photoresist pattern PR2 is removed.

Figure 24G:
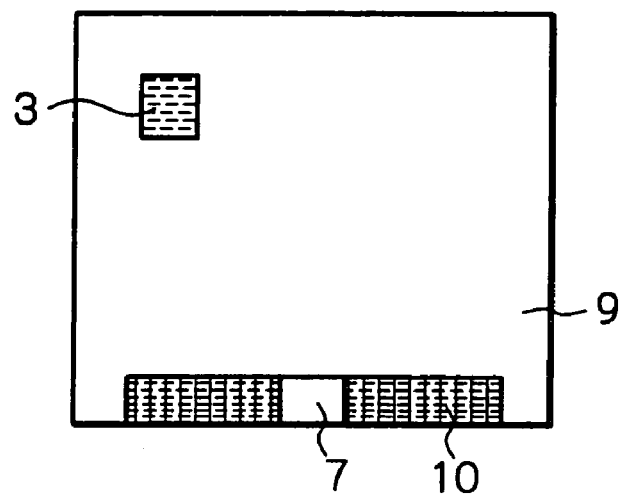

Next, referring to FIG. 24G, the insulating layer 9 is further etched to expose the lower electrode layer 3.

Figure 24H:
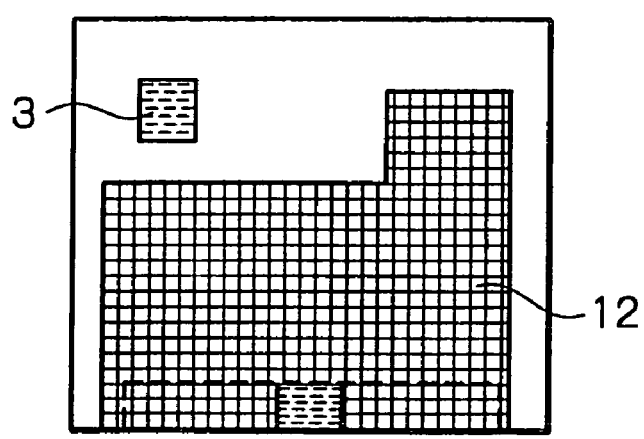

Finally, referring to FIG. 24H, an upper electrode layer 8 and an upper magnetic shield layer 12 are formed.

The method for manufacturing the MTJ-type MR effect transducer of FIGS. 9 and 18 is explained next with reference to FIGS. 25A through 25F.

Figure 25A:
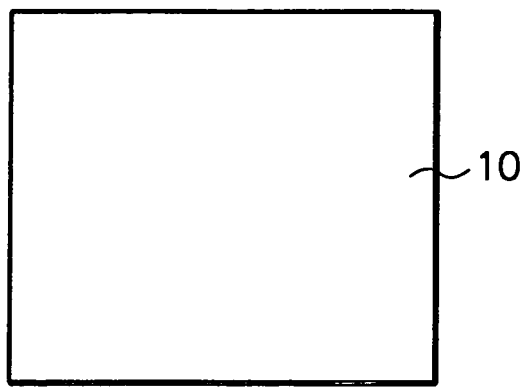
FIGS. 25A through 25F are plan views for explaining the method for manufacturing the MTJ-type MR effect transducer of FIGS. 9 and 18.

First, referring to FIG. 25A, a lower magnetic shield layer 2, a lower electrode layer 3, a pinning layer 4, a pinned layer 5, a barrier layer 6, a free layer 7, an interface control layer 13 and a longitudinal bias layer 10 are sequentially formed on a substrate 1.

Figure 25B:
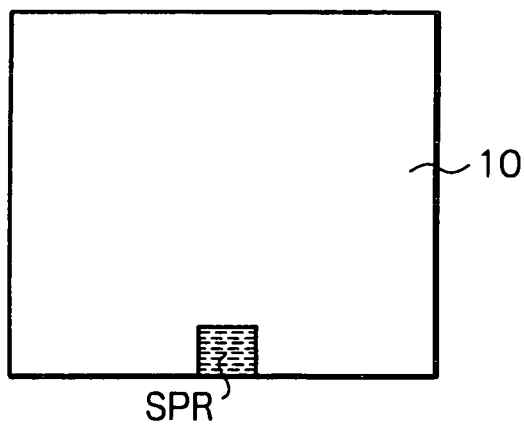

Next, referring to FIG. 25B, a stencil photoresist mask SPR is formed on the longitudinal bias layer 10.

Figure 25C:
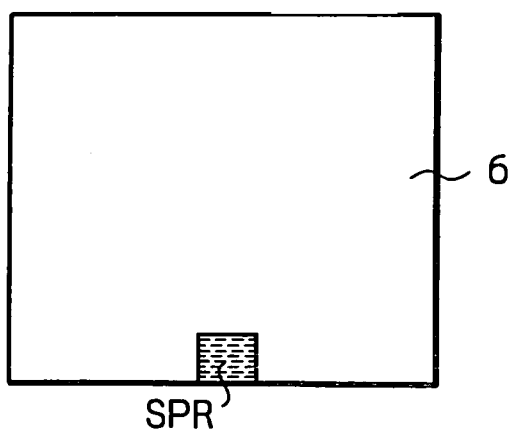

Next, referring to FIG. 25C, the longitudinal bias layer 10, the interface control layer 13 and the free layer 7 are patterned by a milling process to expose the barrier layer 6.

Figure 25D:
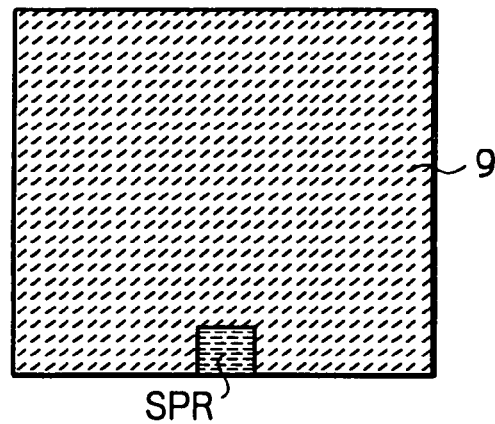

Next, referring to FIG. 25D, an insulating layer 9 is formed, and then, the insulating layer 9 on the stencil photoresist mask SPR is lifted off.

Figure 25E:
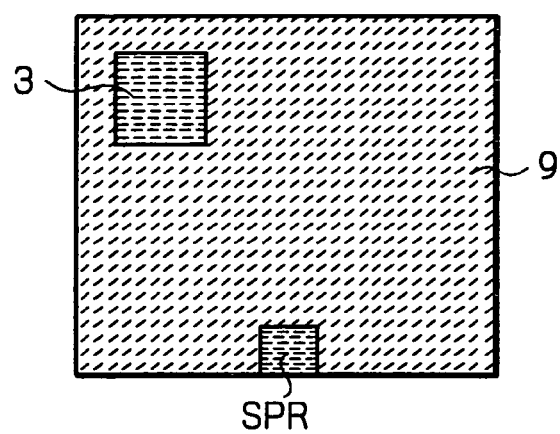

Next, referring to FIG. 25E, the insulating layer 9 is further etched to expose the lower electrode layer 3.

Figure 25F:
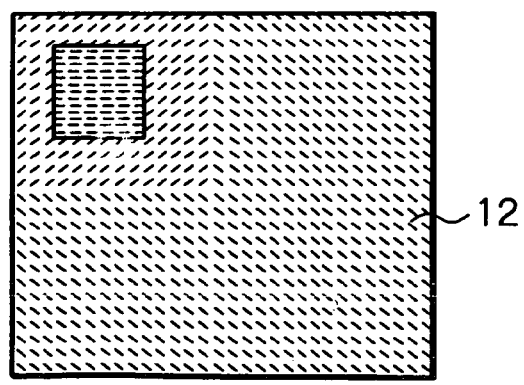

Finally, referring to FIG. 25F, an upper electrode layer 8 and an upper magnetic shield layer 12 are formed.

The method for manufacturing the MTJ-type MR effect transducer of FIGS. 10 and 19 is explained next with reference to FIGS. 26A through 26H.

Figure 26A:
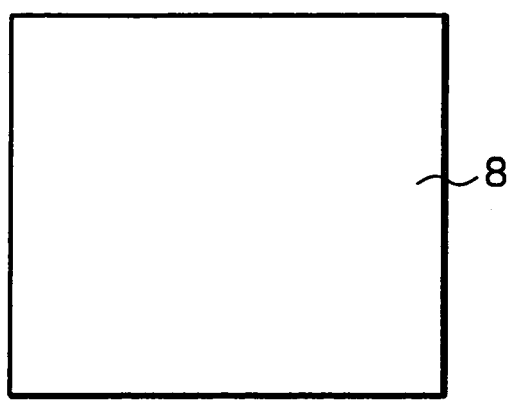
FIGS. 26A through 26H are plan views for explaining the method for manufacturing the MTJ-type MR effect transducer of FIGS. 10 and 19.

First, referring to FIG. 26A, a lower magnetic shield layer 2, a lower electrode layer 3, a free layer 7, a barrier layer 6, a pinned layer 5, a pinning layer 4 and an upper electrode layer 8 are sequentially formed on a substrate 1.

Figure 26B:
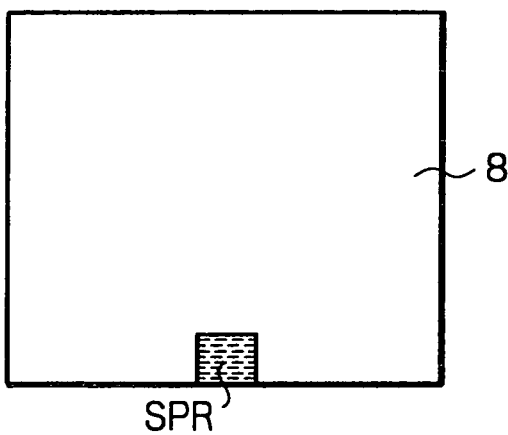

Next, referring to FIG. 26B, a stencil photoresist mask SPR is formed on the upper electrode layer 8.

Figure 26C:
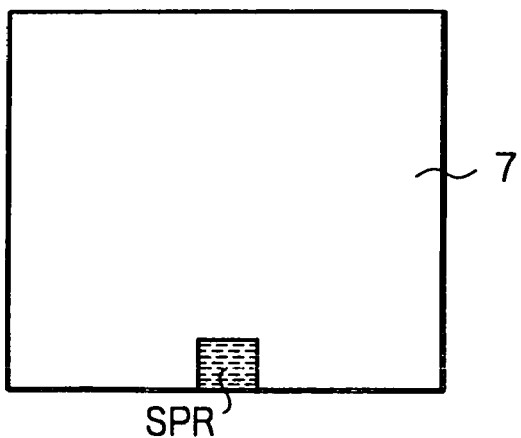

Next, referring to FIG. 26C, the upper electrode layer 8, the pinning layer 4, the pinned layer 5 and the barrier layer 6 are patterned by a milling process to expose the free layer 7. Then, the stencil photoresist mask SPR is removed.

Figure 26D:
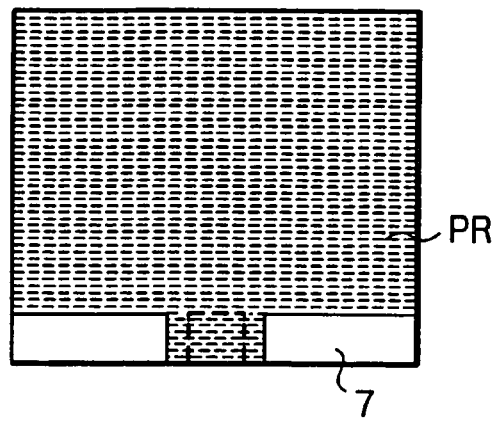

Next, referring to FIG. 26D, a photoresist pattern PR is formed, and a longitudinal bias layer 10 is formed thereon.

Figure 26E:
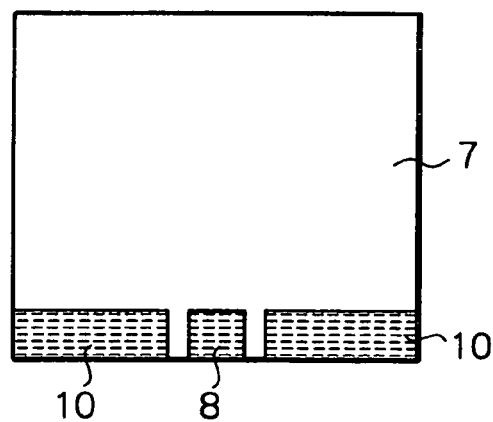

Next, referring to FIG. 26E, the longitudinal bias layer 10 on the photoresist mask PR is lifted off to expose the free layer 7 and the upper electrode layer 8.

Figure 26F:
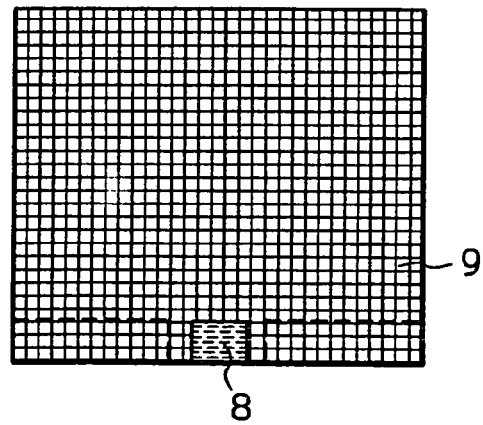

Next, referring to FIG. 26F, an insulating layer 9 is formed, and a chemical mechanical polishing (CMP) process is performed upon the insulating layer 9 to expose the upper electrode layer 8.

Figure 26G:
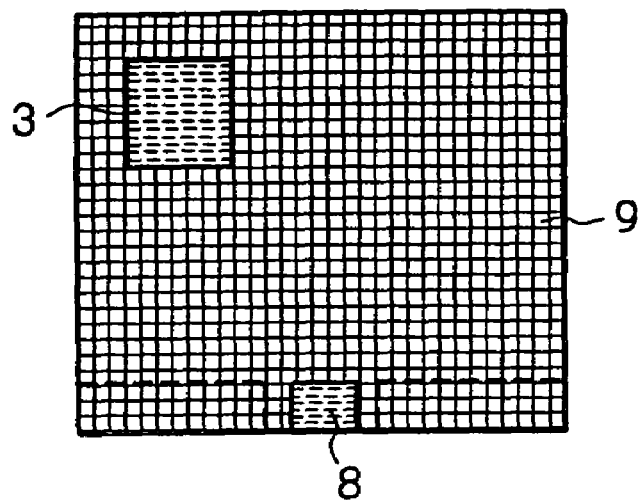

Next, referring to FIG. 26G, the insulating layer 9 is further etched to expose the lower electrode layer 3.

Figure 26H:
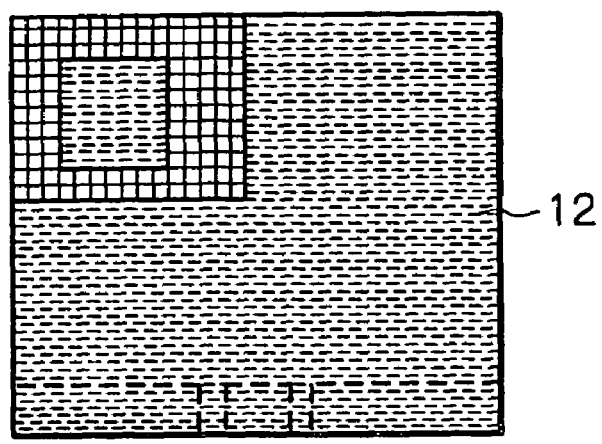

Finally, referring to FIG. 26H, an upper magnetic shield layer 12 is formed.

The method for manufacturing the MTJ-type MR effect transducer of FIGS. 11 and 20 is explained next with reference to FIGS. 27A through 27I.

Figure 27A:
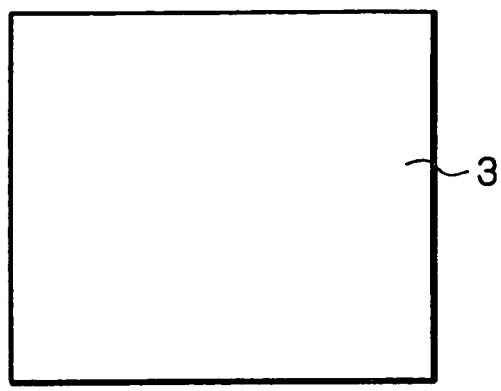
FIGS. 27A through 27I are plan views for explaining the method for manufacturing the MTJ-type MR effect transducer of FIGS. 11 and 20.

First, referring to FIG. 27A, a lower magnetic shield layer 2 and a lower electrode layer 3 are sequentially formed on a substrate 1.

Figure 27B:
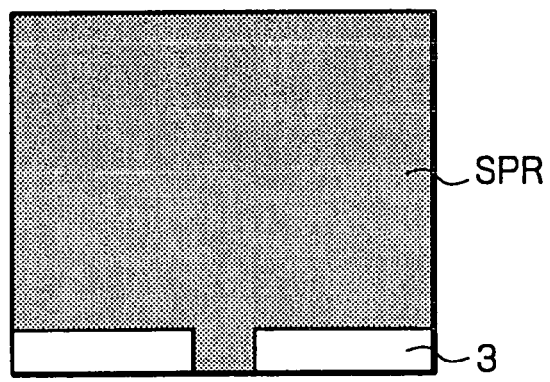

Next, referring to FIG. 27B, a stencil photoresist mask SPR is formed on the lower electrode layer 3.

Figure 27C:
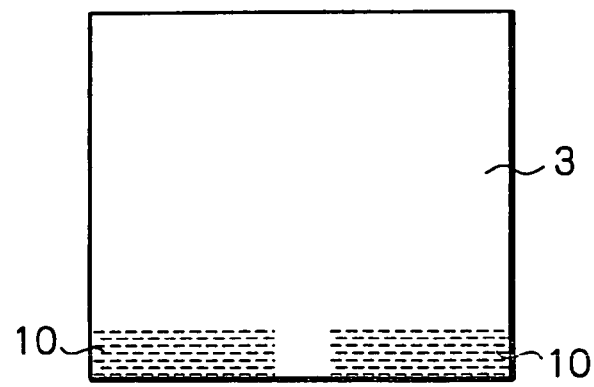

Next, referring to FIG. 27C, a longitudinal bias layer 10 is formed, and then, the longitudinal bias layer 10 on the stencil photoresist mask SPR is lifted off.

Figure 27D:
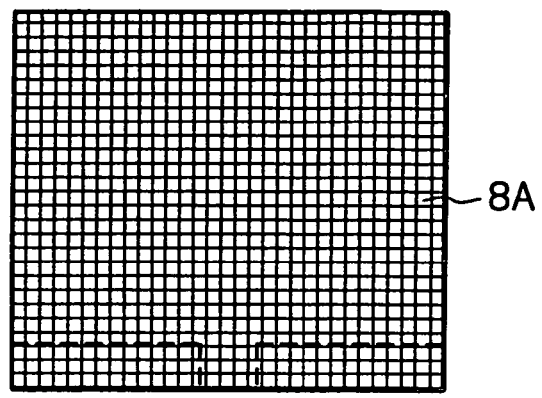

Next, referring to FIG. 27D, a free layer 7, a barrier layer 6, a pinned layer 5, a pinning layer 4 and an upper electrode layer 8A are sequentially formed.

Figure 27E:
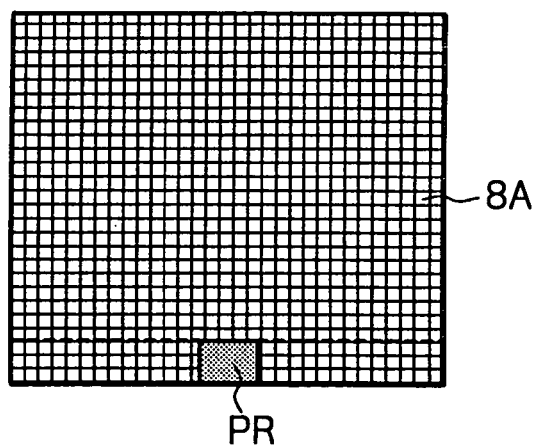

Next, referring to FIG. 27E, a photoresist mask PR is formed.

Figure 27F:
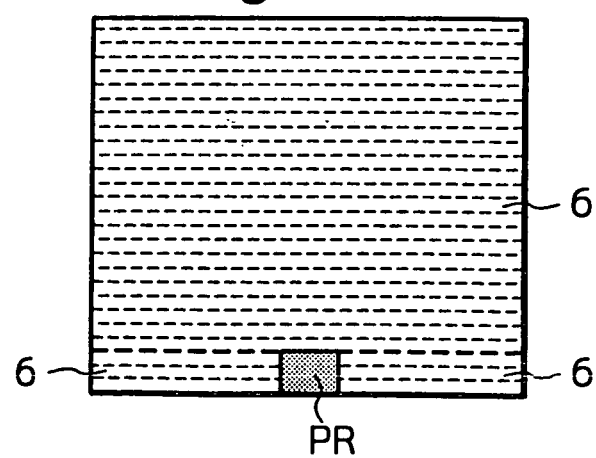

Next, referring to FIG. 27F, the upper electrode layer 8A, the pinning layer 4 and the pinned layer 5 are patterned by a milling process to expose the barrier layer 6. Thus, a mesa structure is obtained.

Figure 27G:
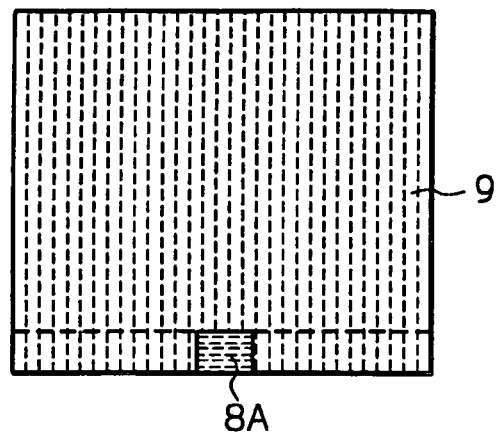

Next, referring to FIG. 27G, an insulating layer 9 is formed, and then, the insulating layer 9 on the photoresist mask PR is lifted off to expose and the upper electrode layer 8A.

Figure 27H:
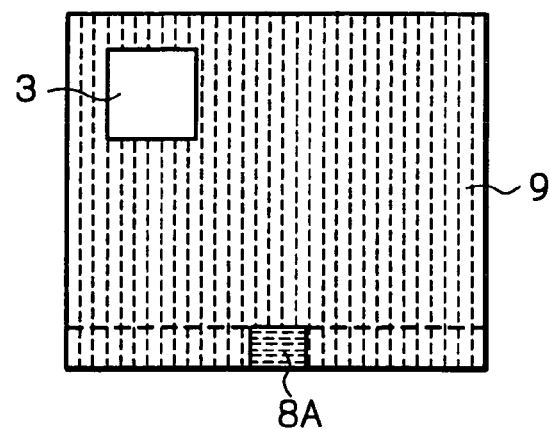

Next, referring to FIG. 27H, the insulating layer 9 is further etched to expose the lower electrode layer 3.

Figure 27I:
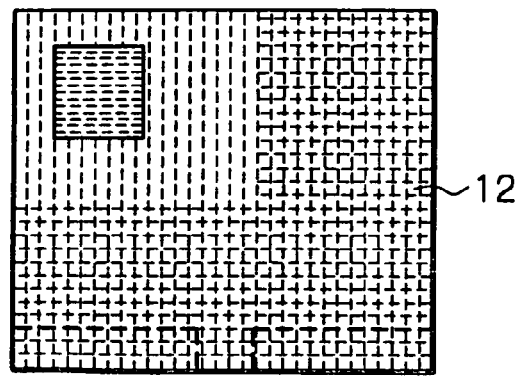

Finally, referring to FIG. 27I, an upper electrode layer 8B and an upper magnetic shield layer 12 is formed.

The MTJ-type MR effect transducers of FIGS. 12 and 13 can be manufactured in a similar way to those as shown in FIGS. 26A through 26H.

The experimental results of the noise characteristics of the above-described embodiments of FIGS. 5 through 11 as compared with the prior art as illustrated in FIG. 3 will be explained next.

The MTJ-type MR effect transducer of FIG. 3 was manufactured in accordance with the following conditions.

The MTJ structure formed by the pinning layer 4, the pinned layer 5, the barrier layer (non-magnetic insulating layer) 6 and the free layer 7 was made of Ta (3 nm)/$Pt_{46}Mn_{54}$ (25 nm) /$Co_{90}Fe_{10}$ (5 nm)/Ru (0.9 nm)/$Co_{90}Fe_{10}$ (5 nm)/Al oxide (2 nm)/$Co_{90}Fe_{10}$ (2 nm)/$Ni_{82}Fe_{18}$ (8 nm)/Ta (3 nm) deposited while applying a first magnetic field thereto. A heating operation at 250° C. for 5 hours was performed upon the MTJ structure while applying a second magnetic field of 39 kA/m (500 Oe) perpendicular to the first magnetic field to the MTJ structure. The other materials were as follows:

the substrate 1 was made of 10 µm thick alumina stacked on 2 mm thick $Al_2O_3$·TiC;

the lower magnetic shield layer 2 was made of 1 µm thick $CO_{65}Ni_{12}Fe_{23}$;

the lower electrode layer 3 and the upper electrode layer 8 were made of Ta (5 nm)/Au (60 nm)/Ta (5 nm);

the insulating layer 9 was made of 20 nm thick alumina;

the longitudinal bias layer 10 was made of Cr (10 nm)/ $CO_{74.5}Cr_{10.5}Pt_{15}$ (36 nm); and the upper magnetic shield layer 12 was made of 1 µm thick $CO_{89}Zr_4Ta_4Cr_3$. The manufactured MTJ-type MR effect transducer was introduced as a read head into a magnetic write/read apparatus as illustrated in FIGS. 1 and 2, so that the read head could read data from a CoCrTa medium which has 3 µm width write tracks with a gap of 0.2 µm and 2 µm read tracks. In this case, a photolithography process using I-rays and a milling process were used for forming the MTJ structure. Also, a heating operation at 250° C. for 2 hours was performed upon a photoresist layer for forming the winding 1021 to harden this photoresist layer. Further, since the direction of the magnetization of the pinned layer 5 was not perpendicular to the air bearing surface ABS, a magnetizing operation using a magnetic field of 39 kA/m (500 Oe) at 200° C. for 1 hour was performed upon the write/read apparatus. In this case, the rotation of the easy axis of the magnetization of the free layer 7 was hardly observed with respect to the direction of the magnetization of the pinned layer 5 from a magnetization curve.

When the coercive magnetic field and the magnetic remanence·thickness (Mr·T) of the medium were 237 kA/m (3.0 k Oe) and 0.35 emu/$cm^2$, respectively, the output voltage, the bit lenght (frequency) by which the output voltage is reduced by half, the signal-to-noise (S/N) ratio and the bit error rate (BER) were observed as shown in FIG. 28. That is, although the output voltage and the bit lenght were not bad, the S/N ratio and the bit error rate were bad. This was because a longitudinal bias magnetic field is not sufficiently applied from the longitudinal bias layers 10 to the free layer 7 due to the presence of the insulating layer 9 therebetween, so that the Barkhausen noise was included in the reproduced signals. Actually, a large hysteresis in the R-H loop caused by the inversion of magnetization of the free layer 7 was observed to show the Barkhausen noise invited by the motion of magnetic domains of the free layer 7.

The MTJ-type MR effect transducers of FIGS. 5, 6, 7, 8, 9, 10 and 11 were manufactured in accordance with the following conditions.

The MTJ structure formed by the pinning layer 4, the pinned layer 5, the barrier layer (insulating layer) 6 and the free layer 7 was made of Ta (3 nm)/$Pt_{46}Mn_{54}$ (25 nm)/ $Co_{90}Fe_{10}$ (5 nm)/Ru (0.9 nm)/$Co_{90}Fe_{10}$ (5 nm)/Al oxide (-2 nm)/$Co_{90}Fe_{10}$ (2 nm)/$Ni_{82}Fe_{18}$ (8 nm)/Ta (3 nm) deposited while applying a first magnetic field thereto. A heating operation at 250° C. for 5 hours was performed upon the MTJ structure while applying a second magnetic field of 39 kA/m (500 Oe) perpendicular to the first magnetic field to the MTJ structure. The other materials were as follows:

the substrate 1 was made of 10 μm thick alumina stacked on 2 mm thick $Al_2O_3 \cdot TiC$;

the lower magnetic shield layer 2 was made of 1 μm thick $Co_{65}Ni_{12}Fe_{23}$;

the lower electrode layer 3 and the upper electrode layer 8 were made of Ta (5 nm)/Au (60 nm)/Ta (5 nm);

the insulating layer 9 was made of 20 nm thick alumina;

the longitudinal bias layer 10 was made of Cr (10 nm)/$CO_{74.5}Cr_{10.5}Pt_{15}$ (36 nm) for FIGS. 5, 6, 7, 8, 9, 10 and 11 and 50 nm thick Ba ferrite for FIG. 8;

the upper magnetic shield layer 12 was made of 1 μm thick $Co_{89}Zr_4Ta_4Cr_3$; and the interface control layer 13 was made of 1.2 nm thick Cu. The manufactured MTJ-type MR effect transducer was introduced as a read head into a magnetic write/read apparatus as illustrated in FIGS. 1 and 2, so that the read head could read data from a CoCrTa medium which has 3 μm width write tracks with a gap of 0.2 μm and 2 μm read tracks. In this case, a photolithography process using I-rays and a milling process were used for forming the MTJ structure. Also, a heating operation at 250° C. for 2 hours was performed upon a photoresist layer for forming the winding 1021 to harden this photoresist layer. Further, since the direction of the magnetization of the pinned layer 5 was not perpendicular to the air bearing surface ABS, a magnetizing operation using a magnetic field of 39 kA/m (500 Oe) at 200° C. for 1 hour was performed upon the write/read apparatus. In this case, the rotation of the easy axis of the magnetization of the free layer 7 was hardly observed with respect to the direction of the magnetization of the pinned layer 5 from a magnetization curve.

When the coercive magnetic field and the magnetic remanence·thickness (Mr·T) of the medium were 237 kA/m (3.0 k Oe) and 0.35 emu/cm², respectively, the output voltage, the bit lenght (frequency) by which the output voltage is reduced by half, the S/N ratio and the bit error rate (BER) were observed as shown in FIG. 28. That is, the output voltage and the bit lenght were not bad, and also, the S/N ratio and the bit error rate were rebit ably improved as compared with the prior art. This was because a longitudinal bias magnetic field was sufficiently applied from the longitudinal bias layers 10 directly to the free layer 7, so that the Barkhausen noise included in the reproduced signals was reduced. Actually, a small hysteresis in the R-H loop caused by the inversion of magnetization of the free layer 7 was observed.

As explained above, the above-described embodiments can be applied to a spin value type MR effect transducer where conductive material is used as a non-magnetic material for the barrier layer 6. In view of this, the experimental results of the noise characteristics of the above-described embodiments of FIGS. 5 through 11 applied to a spin value type as compared with the prior art as illustrated in FIG. 3 applied to a spin value type will be explained next.

The spin value type MR effect transducer of FIG. 3 was manufactured in accordance with the following conditions.

The spin value structure formed by the pinning layer 4, the pinned layer 5, the barrier layer (conductive layer) 6 and the free layer 7 was made of Pt (2 nm)/$Ir_{21}Mn_{79}$ (5 nm)/$Co_{90}Fe_{10}$ (5 nm)/Cu (2 nm)/$Co_{90}Fe_{10}$ (1 nm)/$Ni_{82}Fe_{18}$ (3 nm)/Pt (2 nm) deposited while applying a first magnetic field thereto. A heating operation at 230° C. for 5 hours was performed upon the MTJ structure while applying a second magnetic field of 39 kA/m (500 Oe) perpendicular to the first magnetic field to the spin value structure. The other materials were as follows:

the substrate 1 was made of 10 μm thick alumina stacked on 2 mm thick $Al_2O_3 \cdot TiC$;

the lower magnetic shield layer 2 was made of 0.3 μm thick $CO_{65}Ni_{12}Fe_{23}$;

the lower electrode layer 3 and the upper electrode layer 8 were made of Ta (5 nm)/Au (60 nm)/Ta (5 nm);

the insulating layer 9 was made of 20 nm thick alumina;

the longitudinal bias layer 10 was made of Cr (5 nm)/$CO_{74.5}Cr_{10.5}Pt_{15}$ (12 nm); and the upper magnetic shield layer 12 was made of 0.3 μm thick $CO_{89}Zr_4Ta_4Cr_3$. The manufactured spin value type MR effect transducer was introduced as a read head into a magnetic write/read apparatus as illustrated in FIGS. 1 and 2, so that the read head could read data from a CoCrTa medium which has 0.5 μm width write tracks with a gap of 0.08 μm and 0.2 μm read tracks. In this case, a photolithography process using electron-rays and a reactive ion etching process were used for forming the spin value structure. Also, a heating operation at 250° C. for 2 hours was performed upon a photoresist layer for forming the winding 1021 to harden this photoresist layer. Further, since the direction of the magnetization of the pinned layer 5 was not perpendicular to the air bearing surface ABS, a magnetizing operation using a magnetic field of 39 kA/m (500 Oe) at 180° C. for 1 hour was performed upon the write/read apparatus. In this case, the rotation of the easy axis of the magnetization of the free layer 7 was hardly observed with respect to the direction of the magnetization of the pinned layer 5 from a magnetization curve.

When the coercive magnetic field and the magnetic remanence thickness (Mr·T) of the medium were 237 kA/m (3.0 k Oe) and 0.38 emu/cm², respectively, the output voltage, the bit length (frequency) by which the output voltage is reduced by half, the S/N ratio and the bit error rate (BER) were observed as shown in FIG. 29. That is, although the output voltage and the bit length were not bad, the S/N ratio and the bit error rate were bad. This was because a longitudinal bias magnetic field was not sufficiently applied from the longitudinal bias layers 10 to the free layer 7 due to the presence of the insulating layer 9 there between, so that the Barkhausen noise was included in the reproduced signals. Actually, a large hysteresis in the R-H loop caused by the inversion of magnetization of the free layer 7 was observed to show the Barkhausen noise invited by the motion of magnetic domains of the free layer 7.

The spin value type MR effect transducers of FIGS. 5, 6, 7, 8, 9, 10 and 11 were manufactured in accordance with the following conditions.

The spin value structure formed by the pinning layer 4, the pinned layer 5, the barrier layer (non-magnetic layer) 6 and the free layer 7 was made of Pt (2 nm)/$Ir_{21}Mn_{79}$ (5 nm)/$Co_{90}Fe_{10}$ (5 nm)/Ru (0.9 nm)/$Co_{90}Fe_{10}$ (5 nm)/Cu (2 nm)/$Co_{90}Fe_{10}$ (1 nm)/$Ni_{82}Fe_{18}$ (3 nm)/Pt (2 nm) deposited while applying a first magnetic field thereto. A heating operation at 250° C. for 5 hours was performed upon the MTJ structure while applying a second magnetic field of 39 kA/m (500 Oe) perpendicular to the first magnetic field to the spin value structure. The other materials were as follows:

the substrate 1 was made of 10 μm thick alumina stacked on 2 mm thick $Al_2O_3 \cdot TiC$;

the lower magnetic shield layer 2 was made of 0.3 μm thick $Co_{65}Ni_{12}Fe_{23}$;

the lower electrode layer 3 and the upper electrode layer 8 were made of Ta (5 nm)/Au (60 nm)/Ta (5 nm);

the insulating layer 9 was made of 20 nm thick alumina;

the longitudinal bias layer 10 was made of Cr (5 nm)/$CO_{74.5}Cr_{10.5}Pt_{15}$ (12 nm);

the upper magnetic shield layer 12 was made of 0.3 μm thick $Co_{89}Zr_4Ta_4Cr_3$; and the interface control layer 13 was made of 1.2 nm thick Cu. The manufactured spin value type MR effect transducer was introduced as a read head into a magnetic write/read apparatus as illustrated in FIGS. 1 and 2, so that the read head could read data from a CoCrTa medium which has 0.5 μm width write tracks with a gap of 0.08 μm and 0.2 μm read tracks. In this case, a photolithography process using electron-rays and a reactive ion etching process were used for forming the spin value structure. Also, a heating operation at 250° C. for 2 hours was performed upon a photoresist layer for forming the winding 1021 to harden this photoresist layer. Further, since the direction of the magnetization of the pinned layer 5 was not perpendicular to the air bearing surface ABS, a magnetizing operation using a magnetic field of 39 kA/m (500 Oe) at 200° C. for 1 hour was performed upon the write/read apparatus. In this case, the rotation of the easy axis of the magnetization of the free layer 7 was hardly observed with respect to the direction of the magnetization of the pinned layer 5 from a magnetization curve.

When the coercive magnetic field and the magnetic remanence·thickness (Mr·T) of the medium were 237 kA/m (3.0 k Oe) and 0.35 emu/cm², respectively, the output voltage, the bit lenght (frequency) by which the output voltage is reduced by half, the S/N ratio and the bit error rate (BER) were observed as shown in FIG. 29. That is, the output voltage and the bit lenght were not bad, and also, the S/N ratio and the bit error rate were rebit ably improved as compared with the prior art. This was because a longitudinal bias magnetic field was sufficiently applied from the longitudinal bias layers 10 directly to the free layer 7, so that the Barkhausen noise included in the reproduced signals was reduced. Actually, a small hysteresis in the R-H loop caused by the inversion of magnetization of the free layer 7 was observed.

In FIGS. 28 and 29, note that a bit lenght for showing the density of bits on a medium is denoted by the number of inversions of magnetic fluxes per inch, i.e., kilo flux changes per inch (kFCI).

Thus, in the above-described embodiments, the S/N ratio and the bit error rate BER can be improved as compared with the prior art transducer of FIG. 3.

The experimental results of the manufacturing characteristics of the above-described embodiments of FIGS. 7, 8, 9, 10 and 11 as compared with the prior art as illustrated in FIG. 3 will be explained next.

The MTJ-type MR effect transducer of FIG. 3 was manufactured in accordance with the following conditions.

The MTJ structure formed by the pinning layer 4, the pinned layer 5, the barrier layer (insulating layer) 6 and the free layer 7 was made of Ta (3 nm)/$Pt_{46}Mn_{54}$ (25 nm)/$Co_{90}Fe_{10}$ (5 nm)/Ru (0.9 nm)/$Co_{90}Fe_{10}$ (5 nm)/Al oxide (2 nm)/$Co_{90}Fe_{10}$ (2 nm)/$Ni_{82}Fe_{18}$ (8 nm)/Ta (3 nm) deposited while applying a first magnetic field thereto. A heating operation at 250° C. for 5 hours was performed upon the MTJ structure while applying a second magnetic field of 39 kA/m (500 Oe) perpendicular to the first magnetic field to the MTJ structure. The other materials were as follows:

the substrate 1 was made of 10 μm thick alumina stacked on 2 mm thick $Al_2O_3$.TiC;

the lower magnetic shield layer 2 was made of 1 μm thick $Co_{65}Ni_{12}Fe_{23}$;

the lower electrode layer 3 and the upper electrode layer 8 were made of Ta (5 nm)/Au (60 nm)/Ta (5 nm);

the insulating layer 9 was made of 20 nm thick alumina;

the longitudinal bias layer 10 was made of Cr (10 nm)/$CO_{74.5}Cr_{10.5}Pt_{15}$ (36 nm); and the upper magnetic shield layer 12 was made of 1 μm thick $CO_{89}Zr_4Ta_4Cr_3$. The manufactured MTJ-type MR effect transducer was introduced as a read head into a magnetic write/read apparatus as illustrated in FIGS. 1 and 2, so that the read head could read data from a CoCrTa medium which has 3 μm width write tracks with a gap of 0.2 μm and 2 μm read tracks. In this case, a photolithography process using I-rays and a milling process were used for forming the MTJ structure. Also, a heating operation at 250° C. for 2 hours was performed upon a photoresist layer for forming the winding 1021 to harden this photoresist layer. Further, since the direction of the magnetization of the pinned layer 5 was not perpendicular to the air bearing surface ABS, a magnetizing operation using a magnetic field of 39 kA/m (500 Oe) at 200° C. for 1 hour was performed upon the write/read apparatus. In this case, the rotation of the easy axis of the magnetization of the free layer 7 was hardly observed with respect to the direction of the magnetization of the pinned layer 5 from a magnetization curve.

When the coercive magnetic field and the magnetic remanence·thickness (Mr·T) of the medium were 237 kA/m (3.0 kOe) and 0.35 emu/cm², respectively, the output voltage, was observed as shown in FIG. 30. That is, the output voltage (mV) was almost 0 for nine per ten samples, so that the pinned layer 5 and the free layer 7 were almost short-circuited by the particles or contamination adhered to the sides of the barrier layer 6. Thus, the manufacturing yield is very low, i.e., 10 percent.

The MTJ-type MR effect transducer of FIG. 7 was manufactured in accordance with the following conditions.

The MTJ structure formed by the pinning layer 4, the pinned layer 5, the barrier layer (non-magnetic insulating layer) 6 and the free layer 7 was made of Ta (3 nm)/$Pt_{46}Mn_{54}$ (25 nm)/$Co_{90}Fe_{10}$ (5 nm)/Ru (0.9 nm)/$Co_{90}Fe_{10}$ (5 nm)/Al oxide (2 nm)/$Co_{90}Fe_{10}$ (2 nm)/$Ni_{82}Fe_{18}$ (8 nm)/Ta (3 nm) deposited while applying a first magnetic field thereto. A heating operation at 250° C. for 5 hours was performed upon the MTJ structure while applying a second magnetic field of 39 kA/m (500 Oe) perpendicular to the first magnetic field to the MTJ structure. The other materials were as follows:

the substrate 1 was made of 10 μm thick alumina stacked on 2 mm thick $Al_2O_3$.TiC;

the lower magnetic shield layer 2 was made of 1 μm thick $Co_{65}Ni_{12}Fe_{23}$;

the lower electrode layer 3 and the upper electrode layer 8 were made of Ta (5 nm)/Au (60 nm)/Ta (5 nm), the insulating layer 9 was made of 20 nm thick alumina;

the longitudinal bias layer 10 was made of Cr (10 nm)/$CO_{74.5}Cr_{10.5}Pt_{15}$ (36 nm); and the upper magnetic shield layer 12 was made of 1 μm thick $CO_{89}Zr_4Ta_4Cr_3$. The manufactured MTJ-type MR effect transducer was introduced as a read head into a magnetic write/read apparatus as illustrated in FIGS. 1 and 2, so that the read head could read data from a CoCrTa medium which has 3 μm width write tracks with a gap of 0.2 μm and 2 μm read tracks. In this case, a photolithography process using I-rays and a milling process were used for forming the MTJ structure. Also, a heating operation at 250° C. for 2 hours was performed upon a photoresist layer for forming the winding 1021 to harden this photoresist layer. Further, since the direction of the magnetization of the pinned layer 5 was not perpendicular to the air bearing surface ABS, a magnetizing operation using a magnetic field of 39 kA/m (500 Oe) at 200° C. for 1 hour was performed upon the write/read apparatus. In this case, the rotation of the easy axis of the magnetization of the free layer 7 was hardly observed with respect to the direction of the magnetization of the pinned layer 5 from a magnetization curve.

When the coercive magnetic field and the magnetic remanence·thickness (Mr·T) of the medium were 237 kA/m (3.0 kOe) and 0.35 emu/cm$^2$, respectively, the output voltage, was observed as shown in FIG. 30. That is, the output voltage (mV) was almost 0 for only two per ten samples, so that the pinned layer 5 and the free layer 7 were hardly short-circuited. Thus, the manufacturing yield was very high, i.e., 80 percent.

In FIG. 7, only the free layer 7 made of $Co_{90}Fe_{10}$ (2 nm)/$Ni_{82}Fe_{18}$ (8 nm)/Ta (3 nm) was patterned by a milling process. In this case, even when the barrier layer 6 made of Al oxide (2 nm) was also patterned by this milling process, the manufacturing yield was still high, i.e., 80 percent (see "FIG. 7-1" of FIG. 30). However, when the underlayer made of $Co_{90}Fe_{10}$ (2 nm)/$Ni_{82}Fe_{18}$ (8 nm)/Ta (3 nm) was further patterned by the milling process, the manufacturing yield was very low, i.e., 20 percent (see "FIG. 7-2" of FIG. 30). Also, when the lower electrode layer 3 made of Ta (5 nm)/Au (60 nm)/Ta (5 nm) was further patterned by the milling process, the manufacturing yield was also very low, i.e., 10 percent (see "FIG. 7-3" of FIG. 30).

In the former two cases ("FIG. 7" and "FIG. 7-1" of FIG. 30), the uppermost layer of the MTJ structure, i.e., the free layer 7 was smaller than the lowermost layer of the MTJ structure, i.e., the pinning layer 4 (the pinned layer 5). On the other hand, in the latter two cases ("FIG. 7-2" and "FIG. 7-3" of FIG. 30), the uppermost layer of the MTJ structure, i.e., the free layer 7 had the same pattern as the lowermost layer of the MTJ structure, i.e., the pinning layer 4 (the pinned layer 5).

The MTJ-type MR effect transducer of FIG. 8 was manufactured in accordance with the following conditions.

The MTJ structure formed by the pinning layer 4, the pinned layer 5, the barrier layer (non-magnetic insulating layer) 6 and the free layer 7 was made of Ta (3 nm)/$Pt_{46}Mn_{54}$ (25 nm)/$Co_{90}Fe_{10}$ (5 nm)/Ru (0.9 nm)/$Co_{90}Fe_{10}$ (5 nm)/Al oxide (2 nm)/$Co_{90}Fe_{10}$ (2 nm)/$Ni_{82}Fe_{18}$ (8 nm)/Ta (3 nm) deposited while applying a first magnetic field thereto. A heating operation at 250° C. for 5 hours was performed upon the MTJ structure while applying a second magnetic field of 39 kA/m (500 Oe) perpendicular to the first magnetic field to the MTJ structure. The other materials were as follows:
the substrate 1 was made of 10 μm thick alumina stacked on 2 mm thick $Al_2O_3$.TiC;
the lower magnetic shield layer 2 was made of 1 μm thick $CO_{65}Ni_{12}Fe_{23}$;
the lower electrode layer 3 and the upper electrode layer 8 were made of Ta (5 nm)/Au (60 nm)/Ta (5 nm);
the insulating layer 9 was made of 20 nm thick alumina;
the longitudinal bias layer 10 was made of 50 nm thick Ba ferrite; and
the upper magnetic shield layer 12 was made of 1 μm thick $CO_{89}Zr_4Ta_4Cr_3$. The manufactured MTJ-type MR effect transducer was introduced as a read head into a magnetic write/read apparatus as illustrated in FIGS. 1 and 2, so that the read head could read data from a CoCrTa medium which has 3 μm width write tracks with a gap of 0.2 μm and 2 μm read tracks. In this case, a photolithography process using I-rays and a milling process were used for forming the MTJ structure. Also, a heating operation at 250° C. for 2 hours was performed upon a photoresist layer for forming the winding 1021 to harden this photoresist layer. Further, since the direction of the magnetization of the pinned layer 5 was not perpendicular to the air bearing surface ABS, a magnetizing operation using a magnetic field of 39 kA/m (500 Oe) at 200° C. for 1 hour was performed upon the write/read apparatus. In this case, the rotation of the easy axis of the magnetization of the free layer 7 was hardly observed with respect to the direction of the magnetization of the pinned layer 5 from a magnetization curve.

When the coercive magnetic field and the magnetic remanence·thickness (Mr·T) of the medium were 237 kA/m (3.0 k Oe) and 0.35 emu/cm$^2$, respectively, the output voltage, was observed as shown in FIG. 30. That is, the output voltage (mV) was almost 0 for only three per ten samples, so that the pinned layer 5 and the free layer 7 were hardly short-circuited. Thus, the manufacturing yield was very high, i.e., 70 percent.

In FIG. 8, only the free layer 7 made of $Co_{90}Fe_{10}$ (2 nm)/$Ni_{82}Fe_{18}$ (8 nm)/Ta (3 nm) was patterned by a milling process. In this case, even when the barrier layer 6 made of Al oxide (2 nm) was also patterned by this milling process, the manufacturing yield was still high, i.e., 80 percent (see "FIG. 8-1" of FIG. 30). However, when the underlayer made of $Co_{90}Fe_{10}$ (2 nm)/$Ni_{82}Fe_{18}$ (8 nm)/Ta (3 nm) was further patterned by the milling process, the manufacturing yield was very low, i.e., 10 percent (see "FIG. 8-2" of FIG. 30). Also, when the lower electrode layer 3 made of Ta (5 nm)/Au (60 nm)/Ta (5 nm) was further patterned by the milling process, the manufacturing yield was also very low, i.e., 10 percent (see "FIG. 8-3" of FIG. 30).

In the former two cases ("FIG. 8" and "FIG. 8-1" of FIG. 30), the uppermost layer of the MTJ structure, i.e., the free layer 7 was smaller than the lowermost layer of the MTJ structure, i.e., the pinning layer 4 (the pinned layer 5). On the other hand, in the latter two cases ("FIG. 8-2" and "FIG. 8-3" of FIG. 30), the uppermost layer of the MTJ structure, i.e., the free layer 7 had the same pattern as the lowermost layer of the MTJ structure, i.e., the pinning layer 4 (the pinned layer 5).

The MTJ-type MR effect transducer of FIG. 9 were manufactured in accordance with the following conditions.

The MTJ structure formed by the pinning layer 4, the pinned layer 5, the barrier layer (non-magnetic insulating layer) 6 and the free layer 7 was made of Ta (3 nm)/$Pt_{46}Mn_{54}$ (25 nm)/$Co_{90}Fe_{10}$ (5 nm)/Ru (0.9 nm)/$Co_{90}Fe_{10}$ (5 nm)/Al oxide (2 nm)/$Co_{90}Fe_{10}$ (2 nm)/$Ni_{82}Fe_{18}$ (8 nm)/Ta (3 nm) deposited while applying a first magnetic field thereto. A heating operation at 250° C. for 5 hours was performed upon the MTJ structure while applying a second magnetic field of 39 kA/m (500 Oe) perpendicular to the first magnetic field to the MTJ structure. The other materials were as follows:
the substrate 1 was made of 10 μm thick alumina stacked on 2 mm thick $Al_2O_3$.TiC;
the lower magnetic shield layer 2 was made of 1 μm thick $CO_{65}Ni_{12}Fe_{23}$;
the lower electrode layer 3 and the upper electrode layer 8 were made of Ta (5 nm)/Au (60 nm)/Ta (5 nm);
the insulating layer 9 was made of 20 nm thick alumina;
the longitudinal bias layer 10 was made of Cr (10 nm)/ $CO_{74.5}Cr_{10.5}Pt_{15}$ (36 nm);
the upper magnetic shield layer 12 was made of 1 μm thick $CO_{89}Zr_4Ta_4Cr_3$; and
the interface control layer 13 was made of 1.2 nm thick Cu. The manufactured MTJ-type MR effect transducer was introduced as a read head into a magnetic write/read apparatus as illustrated in FIGS. 1 and 2, so that the read head could read data from a CoCrTa medium which has 3 μm width write tracks with a gap of 0.2 μm and 2 μm read tracks. In this case, a photolithography process using I-rays and a milling process were used for forming the MTJ structure.

Also, a heating operation at 250° C. for 2 hours was performed upon a photoresist layer for forming the winding 1021 to harden this photoresist layer. Further, since the direction of the magnetization of the pinned layer 5 was not perpendicular to the air bearing surface ABS, a magnetizing operation using a magnetic field of 39 kA/m (500 Oe) at 200° C. for 1 hour was performed upon the write/read apparatus. In this case, the rotation of the easy axis of the magnetization of the free layer 7 was hardly observed with respect to the direction of the magnetization of the pinned layer 5 from a magnetization curve.

When the coercive magnetic field and the magnetic remanence·thickness (Mr·T) of the medium were 237 kA/m (3.0 k Oe) and 0.35 emu/cm$^2$, respectively, the output voltage, was observed as shown in FIG. 30. That is, the output voltage (mV) was almost 0 for only three per ten samples, so that the pinned layer 5 and the free layer 7 were hardly short-circuited. Thus, the manufacturing yield was very high, i.e., 70 percent.

In FIG. 9, only the free layer 7 made of $Co_{90}Fe_{10}$ (2 nm)/$Ni_{82}Fe_{18}$ (8 nm)/Ta (3 nm) was patterned by a milling process. In this case, even when the barrier layer 6 made of Al oxide (2 nm) was also patterned by this milling process, the manufacturing yield was still high, i.e., 70 percent (see "FIG. 9-1" of FIG. 30). However, when the underlayer made of $Co_{90}Fe_{10}$ (2 nm)/$Ni_{82}Fe_{18}$ (8 nm)/Ta (3 nm) was further patterned by the milling process, the manufacturing yield was very low, i.e., 10 percent (see "FIG. 9-2" of FIG. 30). Also, when the lower electrode layer 3 made of Ta (5 nm)/Au (60 nm)/Ta (5 nm) was further patterned by the milling process, the manufacturing yield was also very low, i.e., 20 percent (see "FIG. 9-3" of FIG. 30).

In the former two cases ("FIG. 9" and "FIG. 9-1" of FIG. 30), the uppermost layer of the MTJ structure, i.e., the free layer 7 was smaller than the lowermost layer of the MTJ structure, i.e., the pinning layer 4 (the pinned layer 5). On the other hand, in the latter two cases ("FIG. 9-2" and "FIG. 9-3" of FIG. 30), the uppermost layer of the MTJ structure, i.e., the free layer 7 had the same pattern as the lowermost layer of the MTJ structure, i.e., the pinning layer 4 (the pinned layer 5).

The MTJ-type MR effect transducer of FIG. 10 was manufactured in accordance with the following conditions.

The MTJ structure formed by the pinning layer 4, the pinned layer 5, the barrier layer (insulating layer) 6 and the free layer 7 was made of Ta (3 nm)/$Ni_{82}Fe_{18}$ (8 nm)/$Co_{90}Fe_{10}$ (5 nm)/Ru (0.9 nm)/$Co_{90}Fe_{10}$ (5 nm)/Al oxide (2 nm)/$Co_{90}Fe_{10}$ (2 nm)/$Pt_{46}Mn_{54}$ (25 nm)/Ta (3 nm) deposited while applying a first magnetic field thereto. A heating operation at 250° C. for 5 hours was performed upon the MTJ structure while applying a second magnetic field of 39 kA/m (500 Oe) perpendicular to the first magnetic field to the MTJ structure. The other materials were as follows:

the substrate 1 was made of 10 μm thick alumina stacked on 2 mm thick $Al_2O_3$·TiC;

the lower magnetic shield layer 2 was made of 1 μm thick $CO_{65}Ni_{12}Fe_{23}$;

the lower electrode layer 3 and the upper electrode layer 8 were made of Ta (5 nm)/Au (60 nm)/Ta (5 nm);

the insulating layer 9 was made of 20 nm thick alumina;

the longitudinal bias layer 10 was made of Cr (10 nm)/$CO_{74.5}Cr_{10.5}Pt_{15}$ (36 nm); and the upper magnetic shield layer 12 was made of 1 μm thick $CO_{89}Zr_4Ta_4Cr_3$. The manufactured MTJ-type MR effect transducer was introduced as a read head into a magnetic write/read apparatus as illustrated in FIGS. 1 and 2, so that the read head could read data from a CoCrTa medium which has 3 μm width write tracks with a gap of 0.2 μm and 2 μm read tracks. In this case, a photolithography process using I-rays and a milling process were used for forming the MTJ structure. Also, a heating operation at 250° C. for 2 hours was performed upon a photoresist layer for forming the winding 1021 to harden this photoresist layer. Further, since the direction of the magnetization of the pinned layer 5 was not perpendicular to the air bearing surface ABS, a magnetizing operation using a magnetic field of 39 kA/m (500 Oe) at 200° C. for 1 hour was performed upon the write/read apparatus. In this case, the rotation of the easy axis of the magnetization of the free layer 7 was hardly observed with respect to the direction of the magnetization of the pinned layer 5 from a magnetization curve.

When the coercive magnetic field and the magnetic remanence·thickness (Mr·T) of the medium were 237 kA/m (3.0 k Oe) and 0.35 emu/cm$^2$, respectively, the output voltage, was observed as shown in FIG. 30. That is, the output voltage (mV) was almost 0 for only four per ten samples, so that the pinned layer 5 and the free layer 7 were hardly short-circuited. Thus, the manufacturing yield was very high, i.e., 60 percent.

In FIG. 10, only the pinning layer 4, the pinned layer 5 and the barrier layer 6 made of Al oxide (2 nm)/$Co_{90}Fe_{10}$ (2 nm)/$Ni_{82}Fe_{18}$ (8 nm)/Ta (3 nm) was patterned by a milling process.

In FIG. 10, the uppermost layer of the MTJ structure, i.e., the pinning layer 4 (the pinned layer 5) is smaller than the lowermost layer of the MTJ structure, i.e., the free layer 7.

The MTJ-type MR effect transducer of FIG. 11 was manufactured in accordance with the following conditions.

The MTJ structure formed by the pinning layer 4, the pinned layer 5, the barrier layer (insulating layer) 6 and the free layer 7 was made of Ta (3 nm)/$Ni_{82}Fe_{18}$ (8 nm)/$Co_{90}Fe_{10}$ (5 nm)/Ru (0.9 nm)/$Co_{90}Fe_{10}$ (5 nm)/Al oxide (2 nm)/$Co_{90}Fe_{10}$ (2 nm)/$Pt_{46}Mn_{54}$ (25 nm)/Ta (3 nm) deposited while applying a first magnetic field thereto. A heating operation at 250° C. for 5 hours was performed upon the MTJ structure while applying a second magnetic field of 39 kA/m (500 Oe) perpendicular to the first magnetic field to the MTJ structure. The other materials were as follows:

the substrate 1 was made of 10 μm thick alumina stacked on 2 mm thick $Al_2O_3$·TiC;

the lower magnetic shield layer 2 was made of 1 μm thick $CO_{65}Ni_{12}Fe_{23}$;

the lower electrode layer 3 and the upper electrode layer 8 were made of Ta (5 nm)/Au (60 nm)/Ta (5 nm);

the insulating layer 9 was made of 20 nm thick alumina;

the longitudinal bias layer 10 was made of Cr (10 nm)/$CO_{74.5}Cr_{10.5}Pt_{15}$ (36 nm); and the upper magnetic shield layer 12 was made of 1 μm thick $CO_{89}Zr_4Ta_4Cr_3$. The manufactured MTJ-type MR effect transducer was introduced as a read head into a magnetic write/read apparatus as illustrated in FIGS. 1 and 2, so that the read head could read data from a CoCrTa medium which has 3 μm width write tracks with a gap of 0.2 μm and 2 μm read tracks. In this case, a photolithography process using I-rays and a milling process were used for forming the MTJ structure. Also, a heating operation at 250° C. for 2 hours was performed upon a photoresist layer for forming the winding 1021 to harden this photoresist layer. Further, since the direction of the magnetization of the pinned layer 5 was not perpendicular to the air bearing surface ABS, a magnetizing operation using a magnetic field of 39 kA/m (500 Oe) at 200° C. for 1 hour was performed upon the write/read apparatus. In this case, the rotation of the easy axis of the magnetization of the free layer 7 was hardly observed with respect to the direction of the magnetization of the pinned layer 5 from a magnetization curve.

When the coercive magnetic field and the magnetic remanence·thickness (Mr·T) of the medium were 237 kA/m (3.0 k Oe) and 0.35 emu/cm$^2$, respectively, the output voltage, was observed as shown in FIG. 30. That is, the output voltage (mV) was almost 0 for only three per ten samples, so that the pinned layer 5 and the free layer 7 were hardly short-circuited. Thus, the manufacturing yield was very high, i.e., 70 percent.

In FIG. 11, only the pinning layer 4 and the pinned layer 5 made of $Co_{90}Fe_{10}$ (2 nm)/$Ni_{82}Fe_{18}$ (8 nm)/Ta (3 nm) was patterned by a milling process. In this case, even when the barrier layer 6 made of Al oxide (2 nm) was also patterned by this milling process, the manufacturing yield was still high, i.e., 80 percent (see "FIG. 11-1" of FIG. 30).

In the two cases ("FIG. 11" and "FIG. 11-1" of FIG. 30), the uppermost layer of the MTJ structure, i.e., the pinning layer 4 (the pinned layer 5) was smaller than the lowermost layer of the MTJ structure, i.e., the free layer 7.

Thus, in the above-described embodiments, the manufacturing yield can be improved as compared with the prior art transducer of FIG. 3.

The manufacturing yield also can be improved when the above-described embodiments are applied to a spin value structure.

A magnetic write/read apparatus including the MR effect transducer according to the present invention as a read head can be applied to a magnetic disk apparatus which includes three magnetic disks on a base, a head drive circuit and a signal processing circuit on the back of the base. In this case, six magnetic write/read apparatuses are provided in the magnetic disk apparatus.

As explained hereinabove, according to the present invention, the noise characteristics and the manufacturing yield can be improved.

The invention claimed is:

1. A magnetoresistive effect transducer comprising:

a substrate;

a lower magnetic shield layer formed on said substrate;

a pinning layer formed on said lower magnetic shield layer;

a pinned layer formed on said pinning layer, said pinning layer providing an exchange coupling with said pinned layer;

a non-magnetic layer formed on said pinned ferromagnetic layer, said non-magnetic layer being made of one of insulating material and conductive material;

a patterned free layer formed on said non-magnetic layer;

a patterned interface control layer formed on a top surface of said patterned free layer;

a longitudinal bias layer formed on said patterned interface control layer, said patterned interface control layer controlling a bias magnetic field applied by said longitudinal bias layer to said free layer;

an insulating layer formed on a portion of a top surface of said non-magnetic layer and on sides of said longitudinal bias layer, said interface control layer and said free layer; and an upper magnetic shield layer formed on said patterned longitudinal bias layer and said non-magnetic layer, a sense current flowing between said pinned layer and said fire layer through said non-magnetic layer.

2. The transducer as set forth in claim 1, wherein said patterned free layer, said patterned interface control layer and said longitudinal bias layer form a mesa structure relative to said top surface of said non-magnetic layer.

3. The transducer as set forth in claim 1, wherein said longitudinal bias layer is formed on substantially all of a top surface of said patterned interface control layer.

4. The transducer as set forth in claim 1, further comprising:

a lower electrode layer; and an upper electrode layer, said lower electrode layer being inserted between said lower magnetic shield layer and said pinning layer, said upper electrode layer inserted between said longitudinal bias layer and said upper magnetic shield layer.

5. A magnetoresistive effect transducer comprising:

a substrate;

a lower magnetic shield layer formed on said substrate;

a pinning layer formed on said lower magnetic shield layer;

a pinned layer formed on said pinning layer, said pinning layer providing an exchange coupling with said pinned layer;

a non-magnetic layer formed on said pinned ferromagnetic layer, said non-magnetic layer being wade of one of insulating material and conductive material;

a patterned free layer formed on said non-magnetic layer;

a patterned interface control layer formed on a top surface of said patterned free layer;

a longitudinal bias layer formed on said patterned interface control layer, said patterned interface control layer controlling a bias magnetic field applied by said longitudinal bias layer to said free layer;

an insulating layer formed on sides of said longitudinal bias layer, said interface control layer and said free layer;

an upper magnetic shield layer formed on said patterned longitudinal bias layer and said non-magnetic layer, a sense current flowing between said pinned layer and said free layer through said non-magnetic layer; and at least one of a lower electrode layer and an upper electrode layer, said lower electrode layer being inserted between said lower magnetic shield layer and said pinning layer, said upper electrode layer inserted between said longitudinal bias layer and said upper magnetic shield layer.

* * * * *